US008127675B2

(12) United States Patent
Oohashi et al.

(10) Patent No.: US 8,127,675 B2
(45) Date of Patent: Mar. 6, 2012

(54) LITHOGRAPHIC PRINTING PLATE PRECURSOR AND LITHOGRAPHIC PRINTING METHOD

(75) Inventors: Hidekazu Oohashi, Shizuoka (JP); Kazuto Shimada, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 137 days.

(21) Appl. No.: 12/549,080

(22) Filed: Aug. 27, 2009

(65) Prior Publication Data

US 2010/0005989 A1 Jan. 14, 2010

Related U.S. Application Data

(62) Division of application No. 11/386,681, filed on Mar. 23, 2006, now abandoned.

(30) Foreign Application Priority Data

Mar. 23, 2005 (JP) .............................. P.2005-084078
Jul. 13, 2005 (JP) .............................. P.2005-204540

(51) Int. Cl.
*B41F 1/18* (2006.01)
*B41M 5/00* (2006.01)
*G03C 1/00* (2006.01)
*G03F 7/00* (2006.01)

(52) U.S. Cl. ............... 101/450.1; 101/463.1; 430/273.1; 430/302

(58) Field of Classification Search ............... 101/450.1, 101/463.1; 430/302
See application file for complete search history.

(56) References Cited

U.S. PATENT DOCUMENTS

| | | | | |
|---|---|---|---|---|
| 5,426,222 | A * | 6/1995 | Wargo et al. | 562/602 |
| 6,306,555 | B1 * | 10/2001 | Schulz et al. | 430/270.1 |
| 7,282,321 | B2 * | 10/2007 | Mitsumoto et al. | 430/271.1 |
| 2002/0068241 | A1 | 6/2002 | Oohashi et al. | |
| 2003/0036019 | A1 | 2/2003 | Teng | |
| 2005/0026075 | A1 | 2/2005 | Fujimaki | |
| 2005/0037282 | A1 | 2/2005 | Sonokawa | |
| 2005/0208422 | A1 * | 9/2005 | Matsuura et al. | 430/270.1 |
| 2005/0214675 | A1 | 9/2005 | Watanabe et al. | |

FOREIGN PATENT DOCUMENTS

| | | | |
|---|---|---|---|
| EP | 1 266 767 | A2 | 12/2002 |
| EP | 1266767 | A2 * | 12/2002 |
| EP | 1 625 943 | A2 | 2/2006 |
| EP | 1 685 957 | A2 | 8/2006 |
| JP | 2938397 | B2 | 6/1999 |
| JP | 2001-277740 | A | 10/2001 |
| JP | 2002-107929 | A | 4/2002 |
| JP | 2002-287334 | A | 10/2002 |
| JP | 2004-66482 | A | 3/2004 |
| JP | 2005-7655 | A | 1/2005 |
| JP | 2005-59446 | A | 3/2005 |

OTHER PUBLICATIONS

The Effect of Structure upon the Reactions of Organic Compounds, Benzene Derivative, Louis P. Hammett, Journal of American chemical Society, vol. 50, pp. 96-103, (1936).*

Journal of American Chemical Society, "The Effect of Steructure Upon the Reactions of Organic Compounds, Benzene Derivatives," (1937), vol. 59, pp. 96-103.

Office Action issued May 2, 2007 in U.S. Appl. No. 11/386,681.

Office Action issued Oct. 18, 2007 in U.S. Appl. No. 11/386,681.

Office Action issued May 9, 2008 in U.S. Appl. No. 11/386,681.

Office Action issued Feb. 11, 2009 in U.S. Appl. No. 11/386,681.

Office Action issued Jul. 27, 2009 in U.S. Appl. No. 11/386,681.

Japanse Office Action dated May 10, 2011, issued in corresponding Japanese patent application No. 2006-081109 (with English translation).

European Office Action for Application No. 06005981.3 dated Mar. 22, 2011.

* cited by examiner

*Primary Examiner* — Cynthia Kelly
*Assistant Examiner* — Connie P Johnson
(74) *Attorney, Agent, or Firm* — Birch, Stewart, Kolasch & Birch, LLP

(57) ABSTRACT

A lithographic printing plate precursor comprising a support and an image recording layer capable of drawing an image by exposure with an infrared laser, wherein the image recording layer contains (A) an infrared absorbent and (B) an iodonium salt represented by the following formula (1):

$$Ar_1—\overset{\oplus}{I}—Ar_2 \quad \overset{\ominus}{Z} \qquad (1)$$

wherein $Ar_1$ and $Ar_2$ each represents a benzene ring which may have a substituent, provided that two benzene rings are differing in the substituent from each other and a total of Hammett's σ values of substituents on at least one of the benzene rings is a negative value, and Z represents a counter anion.

6 Claims, No Drawings

LITHOGRAPHIC PRINTING PLATE PRECURSOR AND LITHOGRAPHIC PRINTING METHOD

This application is a Divisional Application of application Ser. No. 11/386,681 filed on Mar. 23, 2006 now abandoned, and which claims priority under 35 U.S.C. §119 of Japanese Patent application JP 2005-84078, filed Mar. 23, 2005 and Japanese Patent application JP 2005-204540, filed Jul. 13, 2005, the entire contents of which are hereby incorporated by reference.

FIELD OF THE INVENTION

The present invention relates to a lithographic printing plate precursor assured of good image visibility after exposure and a lithographic printing method using the same. More specifically, the present invention relates to a lithographic printing plate precursor from which a printing plate can be directly produced by scanning an infrared laser based on digital signals of a computer or the like and which are assured of good image visibility after exposure and usable for printing without passing through a development processing step, and also relates to a lithographic printing method of performing printing by using the lithographic printing plate precursor.

BACKGROUND OF THE INVENTION

In general, a lithographic printing plate consists of an oleophilic image area which is receptive to ink and a hydrophilic non-image area which is receptive to fountain solution in the process of printing. Lithographic printing is a method of printing which utilizes the nature of water and oily ink repelling each other, wherein printing is carried out by employing the oleophilic image area as an ink-receiving area and the hydrophilic non-image area as a fountain solution-receiving area (a non-ink-receiving area) in a lithographic printing plate and causing a discrepancy in the ink depositability at the surface of the lithographic printing plate, so as to result in ink depositing on the image area only and subsequently transferring the ink onto a printing substrate such as paper.

In constructing such a lithographic printing plate, a lithographic printing plate precursor having an oleophilic photosensitive resin layer (image-recording layer) formed on a hydrophilic support (a PS plate) has been widely used hitherto. A lithographic printing plate is usually prepared by exposing a lithographic printing plate precursor to light through a printing master such as a lith film and then removing the image-recording layer in the non-image area by dissolution with an alkaline developing solution or an organic solvent, while leaving an image-recording layer in the image area, thereby exposing the surface of the hydrophilic support.

The existing platemaking process for lithographic printing plate precursor necessitates a step of removing the non-image area after light exposure by dissolution with a developing solution which is compatible with the image-recording layer, or the like. However, elimination or simplification of such additional wet treatment is currently listed as a problem to be solved. Particularly, disposal of the waste solutions discharged from the wet treatment has recently attracted much industrial attention in view of the consideration for global environment. Thus, there is an increasing demand for a solution to the foregoing problem.

In this regard, there has been proposed, as a non-treatment (non-development) type not requiring wet treatment, a lithographic printing plate precursor that comprises a image recording layer in which the affinity to the fountain solution or the ink changes in accordance with exposure to light at the surface of the layer, thereby enabling printing without the removal of the image recording layer.

Further, as one of simple and convenient platemaking methods, there has been proposed a method so-called as on-press development method, in which an image-recording layer capable of the removal of the non-image area in a lithographic printing plate precursor in the course of the common printing process, is used to remove the non-image area on the printing press after exposure to light, thereby resulting in a lithographic printing plate.

Specific examples of the on-press development method may include a method of using a lithographic printing plate precursor having an image-recording layer that can be dissolved or dispersed in a fountain solution, an ink solvent or an emulsion of a fountain solution and ink; a method of mechanically removing an image-recording layer by means of contact with an impression cylinder or a blanket cylinder of a printing press; or a method of attenuating the cohesion of an image-recording layer or the adhesion between an image recording layer and a support by penetration of a fountain solution, an ink solvent or the like and then mechanically removing the image-recording layer by means of contact with an impression cylinder or a blanket cylinder.

In addition, unless specified otherwise, the term "development treatment process" as used in the invention means a step of removing an area unexposed to infrared laser light in the image-recording layer of a lithographic printing plate precursor by contacting the image-recording layer with a liquid (usually an alkaline developing solution) by using an apparatus other than a printing press (usually an automatic developing machine), in order to expose the surface of the hydrophilic support. On the other hand, the term "on-press development" means a method and its process of removing an area unexposed to infrared laser light in the image-recording layer of a lithographic printing plate precursor by contacting the image-recording layer with a liquid (usually a printing ink and/or a fountain solution) by using a printing press, in order to expose the surface of the hydrophilic support.

However, in the case of using the image-recording layer in the related-art image-recording method utilizing the ultraviolet ray or visible light, since the image-recording layer is not fixed even after exposure to light, it has been required to employ a troublesome method of, for example, storing the lithographic printing plate precursor after light exposure in a completely light-shielded state or under constant temperature conditions until the point of time to mount the lithographic printing plate precursor on the printing press.

Meanwhile, with the recent spread of digitalization technology of electronically processing, storing and outputting image information by computer, various new image outputting systems coping with such digitalization technology have been put to practical use. In this connection, attention has been given on the computer-to-plate technology of directly preparing a lithographic printing plate without the use of a lith film, by loading digitalized image information on a highly converging radiation ray such as laser light and scan-exposing a lithographic printing plate precursor with the same light. Accordingly, it is one of important technical subjects to obtain a lithographic printing plate precursor that is adaptable to such technology as described above.

As discussed above, a demand for simplification, introduction of dry processes, and elimination of treatment with respect to the platemaking operation is significantly increasing in recent years in the aspects of consideration on the global environment as well as adaptation to digitalization.

Recently, high output lasers such as semiconductor lasers and YAG lasers emitting infrared rays of 760 nm to 1200 nm in wavelength have become available inexpensively. Thus, it is highly expected that these high output lasers are utilized as an image recording means in a method of manufacturing a lithographic printing plate by scan-exposure, which can be easily incorporated into the digitalization technology.

In the related-art platemaking method, a photosensitive lithographic printing plate precursor is exposed to an image pattern at a low to medium illumination intensity, and the property changes in the image pattern induced from a photochemical reaction in the image-recording layer is utilized in the implementation of image recording. On the contrary, in a method of using the above-mentioned high output lasers, an area to be exposed is radiated with a large quantity of light energy in an extremely short period of time to convert the light energy efficiently into heat energy, this heat energy induces thermal changes such as chemical changes, phase changes, or morphological or structural changes in the image recording layer, and these changes are utilized in the implementation of image recording. Therefore, image information is input by means of light energy such as laser light, whereas image recording is achieved by means of a combination of light energy and reactions induced by heat energy. Typically, such a recording system making use of the heat generated by exposure to a high power density light is referred to as "heat mode recording," and the conversion of light energy into heat energy is referred to as "photothermal conversion."

A great advantage of the platemaking method of employing the heat mode recording is that the image-recording layer would not be sensitized under an ordinary level of illumination such as room light, and that fixation of an image recorded by exposure to a light of high intensity of illumination is not essential. That is, a lithographic printing plate precursor used in the heat mode recording is free from any fear of the precursor being sensitized by room light prior to the exposure proper, and fixation of image is not essential after light exposure. Therefore, for example, when a platemaking process is carried out in the on-press development mode, in which process an image recording layer which becomes insolubilized or solubilized by exposure using high output lasers is used to produce a lithographic printing plate having the light-exposed image-recording layer as the image pattern, it is possible to obtain a printing system which would not have an effect on the image even if it were exposed to the ambient room light after the exposure proper. Thus, it is expected to be possible with the use of the heat mode recording, to obtain a lithographic printing plate precursor which may be very appropriately used in the on-press development.

In this regard, Japanese Patent No. 2938397, for example, discloses a lithographic printing plate precursor having provided on a hydrophilic support, an image-formation layer in which hydrophobic thermoplastic polymer particles are dispersed in a hydrophilic binder. Japanese Patent No. 2938397 describes that it is possible to expose said lithographic printing plate precursor to an infrared laser and form an image by means of coalescence of the hydrophobic thermoplastic polymer particles by heat, and then to attach the plate precursor on the cylinder of the printing press and to develop on-press using a fountain solution and/or an ink.

However, it was discovered regarding the foregoing method of forming an image by coalescence of microparticles resulting from simple thermal fusion, that although the method exhibits good ability for the on-press development, it results in weak image intensity and insufficient resistance to printing.

For this reason, it has been proposed to improve the resistance to printing using a polymerization reaction. For instance, JP-A No. 2001-277740 describes a lithographic printing plate precursor having an image-recording layer (thermosensitive layer) containing microcapsules which comprise a polymeric compound, on a hydrophilic support. Furthermore, JP-A No. 2002-287334 describes a lithographic printing plate precursor having a support and an image-recording layer (photosensitive layer) containing an infrared absorbent, a radical polymerization initiator and a polymeric compound constructed thereon.

Also, a lithographic printing plate precursor using an iodonium salt and an infrared absorbent is known, but conventional lithographic printing plate precursors are in need of more improvement on the visibility of the drawn image after laser exposure as well as on the storage stability.

SUMMARY OF THE INVENTION

In general, as a step preceding the mounting of a printing plate to the printing press, an operation of inspection and identification of the image on the printing plate is carried out in the aspects of whether image recording is done on the printing plate as intended, how many ink colors can be used for the printing plate, or the like. For the related-art lithographic printing plate precursor necessitating the process of development, it becomes generally easy to confirm the image after platemaking (after development) and before printing (before mounting the printing plate on the printing press), by having the image-recording layer colored.

However, for a lithographic printing plate precursor of the on-press development type or the non-treatment (non-development) type, which does not require the process of development prior to printing, image does not exist on the printing plate and identification of the printing plate cannot be carried out in the step of mounting the printing plate on the printing press. Consequently, often there occur mistakes in the operation. Particularly, it is considered important in the printing process for multicolor printing, the ability to judge whether the register mark that serves as an index to estimate the position appears clearly. The object of the invention is to provide a solution to such problem.

That is, an object of the present invention is to provide a lithographic printing plate precursor assured of high storage stability and good press life and excellent in the visibility of plate after exposure as well as in the on-press developability. Another object of the present invention is to provide a lithographic printing method using the lithographic printing plate precursor.

The present invention is as follows.

(1) A lithographic printing plate precursor comprising a support and an image recording layer capable of drawing an image by exposure with an infrared laser, wherein the image recording layer comprises (A) an infrared absorbent and (B) an iodonium salt represented by the following formula (1):

(1)

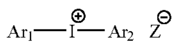

wherein $Ar_1$ and $Ar_2$ each represents a benzene ring which may have a substituent, provided that two benzene rings are differing in the substituent from each other and the total of Hammett's σ values of substituents on at least one benzene ring is a negative value, and Z represents a counter anion. The lithographic printing plate precursor may allow for printing by loading it on a printing press without passing through a development processing step after recording an image or by recording an image after loading it on a printing press.

(2) The lithographic printing plate precursor as described in (1), wherein the iodonium salt represented by the formula (1) is an iodonium salt represented by the following formula (1a):

$$Ar_{1a}—\overset{\oplus}{I}—Ar_{2a}\quad \overset{\ominus}{Z} \qquad (1a)$$

wherein $Ar_{1a}$ represents a benzene ring having a substituent, provided that the total of Hammett's σ values of substituents is a negative value, $Ar_{2a}$ represents a benzene ring having a substituent, provided that the total of Hammett's σ values of substituents is a positive value, and Z represents a counter anion.

(3) The lithographic printing plate precursor as described in (1), wherein in formula (1), the total of Hammett's σ values of substituents on the benzene ring of $Ar_1$ is 0 or less, and the total of Hammett's σ values of substituents on the benzene ring of $Ar_2$ is 0 or less.

(4) A lithographic printing plate precursor comprising a support and an image recording layer capable of drawing an image by exposure with an infrared laser, wherein (A) an infrared absorbent and (B) an iodonium salt represented by the following formula (1) or (Ba) an iodonium salt represented by formula (1a) are contained in a layer different from the image recording layer. The lithographic printing plate precursor may allow for printing by loading it on a printing press without passing through a development processing step after recording an image or by recording an image after loading it on a printing press.

(5) The lithographic printing plate precursor as described in any one of (1) to (4), wherein the image recording layer further comprises (C) a radical-polymerizable compound.

(6) The lithographic printing plate precursor as described in any one of (1) to (5), wherein the layer containing an iodonium salt further comprises (D) a compound of changing in the color under the action of a radical.

(7) The lithographic printing plate precursor as described in any one of (1) to (6), wherein at least one of the compounds (A) to (D) is enclosed in a microcapsule.

(8) A lithographic printing method comprising a step of image-exposing the lithographic printing plate precursor described in any one of (1) to (7), a step of removing the image recording layer in the unexposed part of the image-exposed lithographic printing plate precursor, thereby producing a printing plate, and a step of performing printing by using the produced lithographic printing plate.

According to the present invention, a lithographic printing plate precursor assured of high storage stability and good press life and excellent in the visibility of plate after exposure as well as in the on-press developability can be provided. Furthermore, according to the present invention, a lithographic printing method using the lithographic printing plate precursor can be provided.

DETAILED DESCRIPTION OF THE INVENTION

The present invention is described below.

(A) Infrared Absorbent

In the lithographic printing plate precursor of the present invention, an infrared absorbent is used so as to elevate the sensitivity to an infrared laser. The infrared absorbent has a function of converting the absorbed infrared ray into heat. The infrared absorbent for use in the present invention is a dye or pigment having an absorption maximum at a wavelength of 760 to 1,200 nm.

As such a dye, use may be made of commercially available dyes and those known in the literature such as, for example, "Handbook of Dyes" (the Society of Organic Synthetic Chemistry, ed. (1970)). Specifically, mention may be made of azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squalium colorants, pyrylium salts, metal-thiolate complexes and the like.

As preferred dyes, mention may be made of, for example, the cyanine dyes as described in JP-A Nos. 58-125246, 59-84356, 60-78787 and the like; the methine dyes as described in JP-A Nos. 58-173696, 58-181690, 58-194595 and the like; the naphthoquinone dyes as described in JP-A Nos. 58-112793, 58-224793, 59-48187, 59-73996, 60-52940, 60-63744 and the like; the squalium colorants as described in JP-A No. 58-112792 or the like; the cyanine dyes as described in GB No. 434,875; and the like.

Further, the near infrared absorber/sensitizer as described in U.S. Pat. No. 5,156,938 is also most preferably used, and also preferably used are the substituted arylbenzo(thio)pyrylium salts described in U.S. Pat. No. 3,881,924; the trimethine thiapyrylium salts described in JP-A No. 57-142645 (U.S. Pat. No. 4,327,169); the pyrylium-based compounds described in JP-A Nos. 58-181051, 58-220143, 59-41363, 59-84248, 59-84249, 59-146063 and 59-146061; the cyanine colorants described in JP-A No. 59-216146; the pentamethine thiopyrylium salts described in U.S. Pat. No. 4,283,475; or the pyrylium compounds described in JP-B Nos. 5-13514 and 5-19702. Further, other preferred examples of dyes may include the near infrared absorbing dyes as represented by Formula (I) and Formula (II) in U.S. Pat. No. 4,756,993.

Further, other preferred examples of the infrared absorbing colorant of the invention may include specific indolenine cyanine colorants as described in JP-A No. 2002-278057, which are illustrated below.

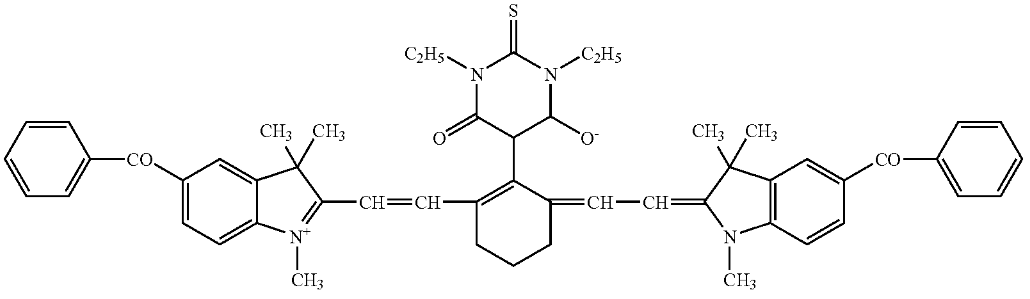

-continued

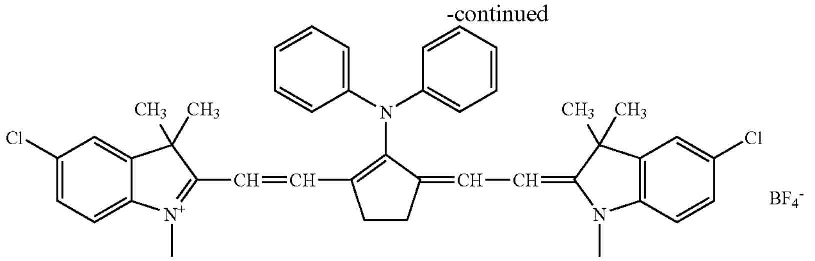

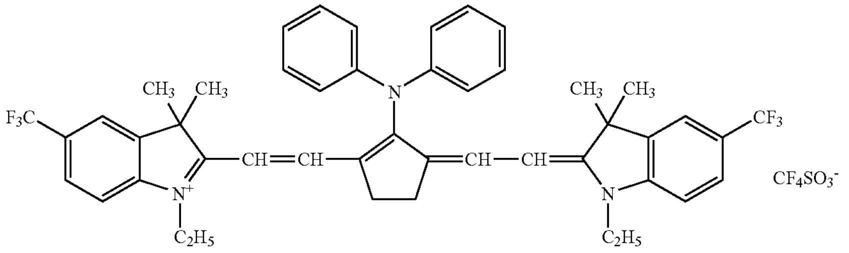

Among these dyes, preferred are a cyanine dye, a squarylium dye, a pyrylium salt, a nickel thiolate complex and an indolenine cyanine dye, more preferred are a cyanine dye and an indolenine cyanine dye, still more preferred is a cyanine dye represented by the following formula (I):

(I)

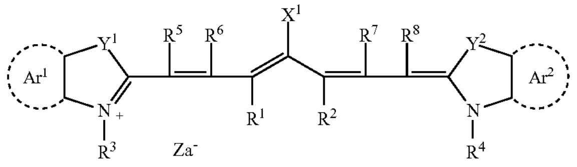

In formula (I), $X^1$ represents a hydrogen atom, a halogen atom, —$NPh_2$, $X^2$-$L^1$ or a group shown below (wherein $X^2$ represents an oxygen atom, a nitrogen atom or a sulfur atom, $L^1$ represents a hydrocarbon group having from 1 to 12 carbon atoms, an aromatic ring having a heteroatom, or a hydrocarbon group having from 1 to 12 carbon atoms and containing a heteroatom (the heteroatom as used herein indicates N, S, O, a halogen atom or Se), $X_a^-$ has the same definition as $Za^-$ described later, and $R^a$ represents a substituent selected from a hydrogen atom, an alkyl group, an aryl group, a substituted or unsubstituted amino group and a halogen atom).

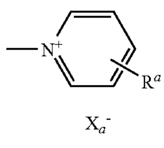

$R^1$ and $R^2$ each independently represents a hydrocarbon group having from 1 to 12 carbon atoms. In view of storage stability of the coating solution for the recording layer, $R^1$ and $R^2$ each is preferably a hydrocarbon group having 2 to more carbon atoms, and $R^1$ and $R^2$ are more preferably combined with each other to form a 5- or 6-membered ring.

$Ar^1$ and $Ar^2$ may be the same or different and each represents an aromatic hydrocarbon group which may have a substituent. Preferred examples of the aromatic hydrocarbon group include a benzene ring and a naphthalene ring. Preferred examples of the substituent include a hydrocarbon group having 12 or less carbon atoms, a halogen atom and an alkoxy group having 12 or less carbon atoms. $Y^1$ and $Y^2$ may be the same or different and each represents a sulfur atom or a dialkylmethylene group having 12 or less carbon atoms. $R^3$ and $R^4$ may be the same or different and each represents a hydrocarbon group having 20 or less carbon atoms, which may have a substituent. Preferred examples of the substituent include an alkoxy group having 12 or less carbon atoms, a carboxyl group and a sulfo group. $R^5$, $R^6$, $R^7$ and $R^8$ may be the same or different and each represents a hydrogen atom or a hydrocarbon group having 12 or less carbon atoms and in view of availability of the raw material, preferably a hydrogen atom. $Za^-$ represents a counter anion, but when the cyanine dye represented by formula (I) has an anionic substituent in its structure and neutralization of electric charge is not necessary, $Za^-$ is not present. In view of storage stability of the coating solution for the recording layer, $Za^-$ is preferably halogen ion, perchlorate ion, tetrafluoroborate ion, hexafluorophosphate ion or sulfonate ion, more preferably perchlorate ion, hexafluorophosphate ion or arylsulfonate ion.

Specific examples of the cyanine dye represented by formula (I), which can be suitably used in the present invention, include those described in paragraphs [0017] to of JP-A-2001-133969.

Other particularly preferred examples include specific indolenine cyanine dyes described in JP-A-2002-278057 supra.

For the pigments used in the invention, use may be made of commercially available pigments and the pigments as described in the handbook of Color Index (C.I.), “Handbook of New Pigments” (Japan Association of Pigment Technology, ed. (1977)), “New Pigment Application Technology” (published by CMC (1986)) and “Printing Ink Technology” (published by CMC (1984)).

The types of pigments may include Black pigments, Yellow pigments, Orange pigments, Brown pigments, Red pigments, Magenta pigments, Blue pigments, Green pigments, fluorescent pigments, metal powder pigments and other polymer-bound pigments. Specifically, insoluble azo pigments, azo lake pigments, condensed azo pigments, chelate azo pigments, phthalocyanine-based pigments, anthraquinone-based pigments, perylene- and perinone-based pigments, thio indigo-based pigments, quinacridone-based pigments, dioxadine-based pigments, isoindolinone-based pigments, quinophthalone-based pigments, hydrated lake pigments, azine pigments, nitroso pigments, nitro pigments, natural pigments, fluorescent pigments, inorganic pigments, carbon black or the like may be used. Among these pigments, preferred is carbon black.

These pigments may be used with or without being subjected to surface treatment. As the method of surface treatment, a method of surface coating with a resin or wax, a method of adhering surfactants, a method of binding a reactive substance (e.g., silane coupling agent, epoxy compound, polyisocyanate, etc.) onto the pigment surface or the like may be envisaged. The above-mentioned methods for surface treatment are described in "Properties and Application of Metal Soaps" (Saiwai Shobo Co., Ltd.), "Printing Ink Technology" (published by CMC (1984)) and "New Pigment Application Technology" (published by CMC (1986)).

The particle diameter of the pigments is preferably in a range of 0.01 to 10 μm, more preferably in the range 0.05 to 1 μm, and particularly preferably in the range 0.1 to 1 μm. Within these ranges, good stability of the pigment dispersion in the coating liquid for the image recording layer and good uniformity in the image recording layer are obtained.

For the method of dispersing pigments, known dispersion techniques used in the manufacture of ink, toner or the like can be used. As the dispersion machine, mention may be made of an ultrasonic dispersion machine, a sand mill, an attritor, a pearl mill, a super mill, a ball mill, an impeller, a disperser, a KD mill, a colloid mill, Dynatron, a three-roll mill, a pressurized kneader and the like. Details can be found in "New Pigment Application Technology" (published by CMC (1986)).

The infrared absorbent may be added together with other components in the same layer or may be added to a layer provided separately. Also, the infrared absorbent may be added by enclosing it in a microcapsule. As for the amount added, the infrared absorbent is preferably added such that when added to the image recording layer of a negative lithographic printing plate precursor, the absorbancy of the image recording layer at a maximum absorption wavelength in the wavelength range of 760 to 1,200 nm becomes from 0.3 to 1.2, more preferably from 0.4 to 1.1, as measured by a reflection measuring method. Within this range, a uniform polymerization reaction proceeds in the depth direction of the image recording layer, and the image area can have good film strength and good adhesion to the support.

The absorbancy of the image recording layer can be adjusted by the amount of the infrared absorbent added to the image recording layer and the thickness of the image recording layer. The absorbancy can be measured by an ordinary method. Examples of the measuring method include a method where an image recording layer having a thickness appropriately decided within the range of the dry coated amount necessary as a lithographic printing plate is formed on a reflective support such as aluminum and the reflection density is measured by an optical densitometer, and a method of measuring the absorbancy by a spectrophotometer according to a reflection method using an integrating sphere.

(B) Iodonium Salt Represented by Formula (1)

In the lithographic printing plate precursor of the present invention, an iodonium salt represented by the following formula (1) is used.

$$Ar_1—\overset{\oplus}{I}—Ar_2\ \ \overset{\ominus}{Z} \qquad (1)$$

In formula (1), $Ar_1$ and $Ar_2$ each represents a benzene ring which may have a substituent, provided that two benzene rings are differing in the substituent from each other and the total of Hammett's σ values of substituents on at least one benzene ring is a negative value, and Z represents a counter anion.

In formula (1), the term "two benzene rings are differing in the substituent from each other" includes not only the case where the substituents present on two benzene rings differ but also the case where one benzene ring has a substituent and another benzene ring has no substituent.

The iodonium salt represented by formula (1) is preferably represented by the following formula (1a):

$$Ar_{1a}—\overset{\oplus}{I}—Ar_{2a}\ \ \overset{\ominus}{Z} \qquad (1a)$$

In formula (1a), $Ar_{1a}$ represents a benzene ring having a substituent, provided that the total of Hammett's σ values of substituents is a negative value, $Ar_{2a}$ represents a benzene ring having a substituent, provided that the total of Hammett's σ values of substituents is a positive value, and Z represents a counter anion.

The counter anion represented by Z in formulae (1) and (1a) is preferably halogen ion, perchlorate ion, tetrafluoroborate ion, hexafluorophosphate ion, carboxylate ion or sulfonate ion, more preferably tetrafluoroborate ion, hexafluorophosphate ion or perfluoroalkylsulfonate ion.

The Hammett's σ value is, as described in *Kagaku Seminar 10, Hammett Soku-Kozo to Han'no Sei*—(*Chemistry Seminar 10, Hammett's Rule—Structure and Reactivity*—, σ value showing the effect of a meta-substituent and a para-substituent on the acid dissociation equilibrium of a benzoic acid in water at 25° C. A negative value indicates that the substituent is an electron-donating substituent, and a positive value indicates that the substituent is an electron-withdrawing substituent. As for the ortho-substituent, the Hammett'σ value is calculated by using the value of the substituent at the p-position therefor.

In calculating the total of Hammett's σ values, the σm value is used for the substituent at the m-position with respect to the C—I bond, and the σp value is used for the substituent at the p-position.

The iodonium salt suitably used in the present invention may be any iodonium salt as long as it is an iodonium salt where when the total of these Hammett's σ values in each benzene ring is calculated, the total of at least one benzene ring is a negative value.

In the iodonium salt for use in the present invention, the totals of Hammett's σ values of two benzene rings are preferably 0 or less, respectively.

The iodonium salt for use in the present invention may be any iodonium salt as long as in formula (1), the substituents on two benzene rings are different from each other and the total of Hammett's σ values of substituents on at least one benzene ring is a negative value, but an iodonium salt represented by formula (2) is preferred, where the substituents on two benzene rings are different from each other and the total of Hammett's σ values of substituents on at least one benzene ring is a negative value.

(2)

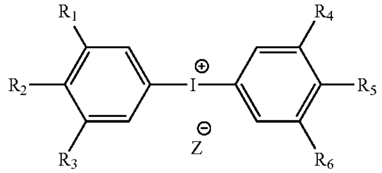

In formula (2), $R_1$ to $R_6$ each independently represents hydrogen, an alkyl group, an aryl group, an alkenyl group, an alkynyl group, a halogen, a cyano group, a nitro group, $-OR_7$, $-OCOR_7$, $-OCONR_7R_8$, $-OSO_2R_7$, $-OPO(OR_7)(OR_8)$, $-OSiR_7R_8R_9$, $-COR_7$, $-COOR_7$, $-CONR_7R_8$, $-NR_7R_8$, $-NR_7COR_8$, $-NR_7COOR_5$, $-NR_7CONR_8R_9$, $-N(COR_7)(COR_8)$, $-N^+R_7R_8R_9.Y^-$, $-NR_7SO_2R_8$, $-SR_7$, $-SOR_7$, $-SO_2R_7$, $-SO_3R_7$, $-SO_2NR_7R_9$, $-PR_7R_8$, $-PO(OR_7)(OR_8)$ or $-SiR_7R_8R_9$, $R_7$ to $R_9$ each independently represents hydrogen, an alkyl group, an aryl group, an alkenyl group or an alkynyl group, and Z and Y each represents a counter anion.

Among these substituents, the substituents having a positive Hammett's σ value and the substituents having a negative Hammett's σ value are as follows:

σm>0: a halogen, a haloalkyl, a cyano group, a nitro group, $-OCOR_7$, $-OSO_2R_7$, $-COR_7$, $-CONR_7R_9$ and $-SO_2R_7$;

σm<0: $-NR_7R_8$ and an alkyl group;

σp>0: a halogen, a haloalkyl, a cyano group, a nitro group, $-OCOR_7$, $-OSO_2R_7$, $-COR_7$, $-COOR_7$, $-CONR_7R_8$ and $-SO_2R_7$; and σp<0: $-NR_7R_8$, $-OR_7$ and an alkyl group.

Specific examples of the iodonium salt for use in the present invention is set forth below, but the present invention is not limited thereto.

(Io-1)

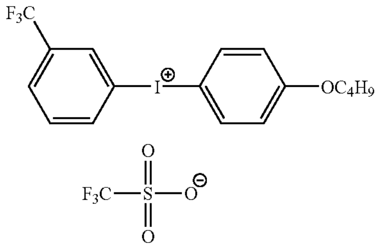

(Io-2)

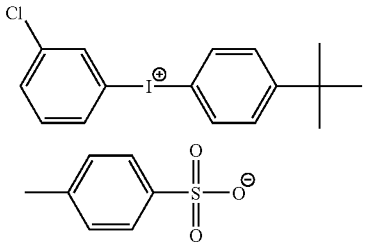

-continued (Io-3)

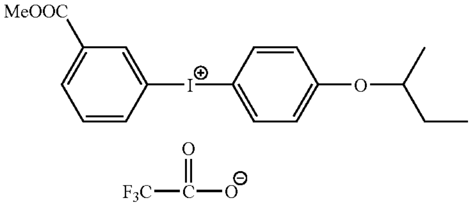

(Io-4)

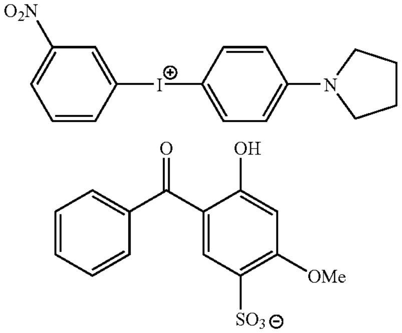

(Io-5)

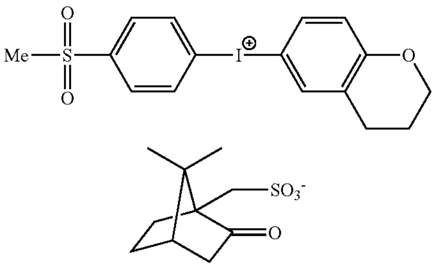

(Io-6)

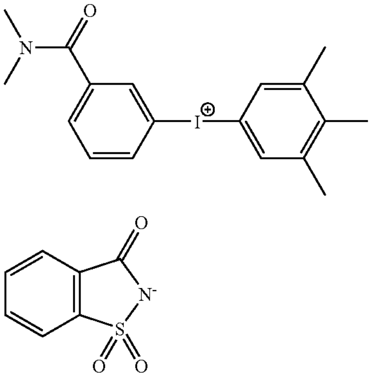

(Io-7)

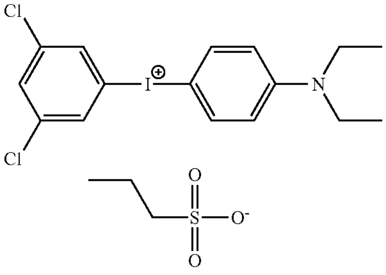

(Io-8)

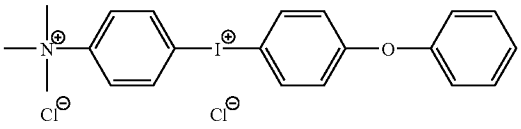

-continued
(Io-9)
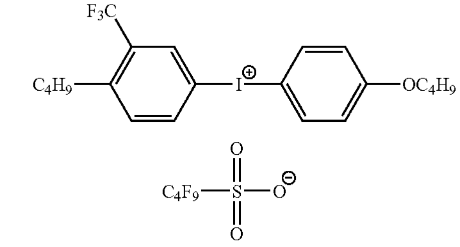
(Io-10)
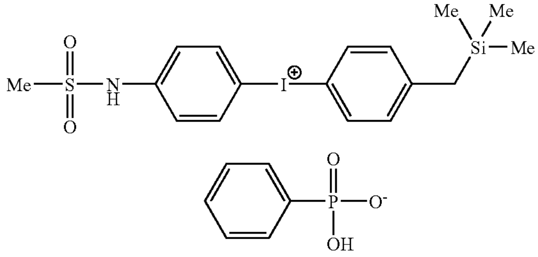
(II-1)
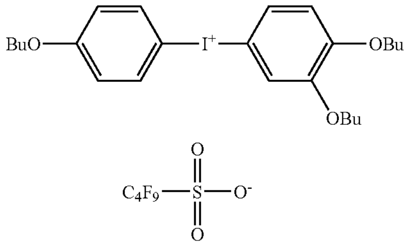
(II-2)
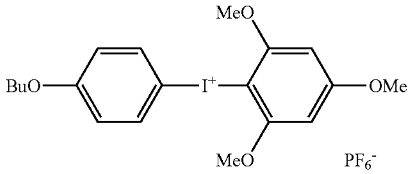
(II-3)
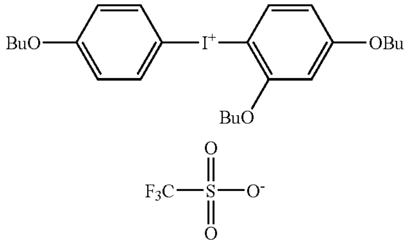
(II-4)
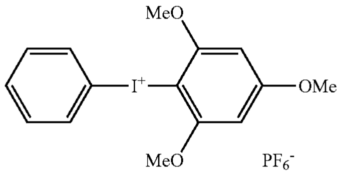
(II-5)
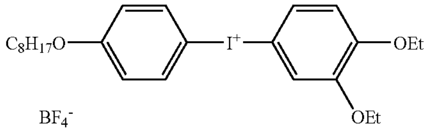
-continued
(II-6)
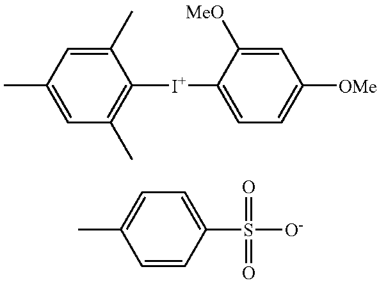
(II-7)
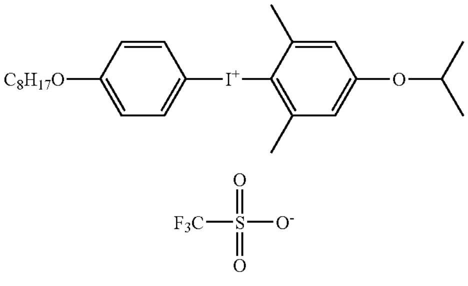
(II-8)
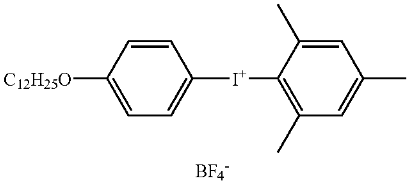
(II-9)
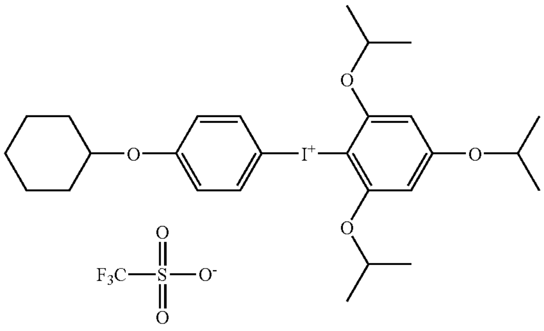
(II-10)
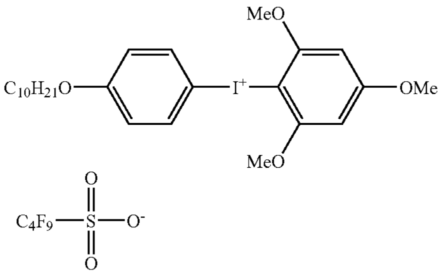

-continued (II-11)

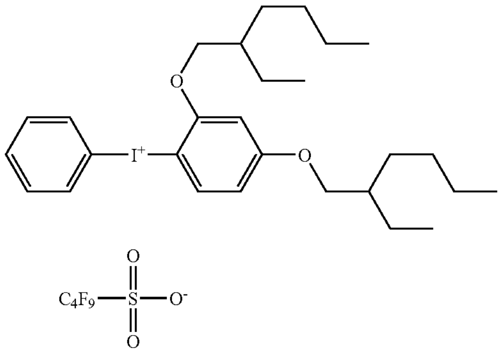

(II-12)

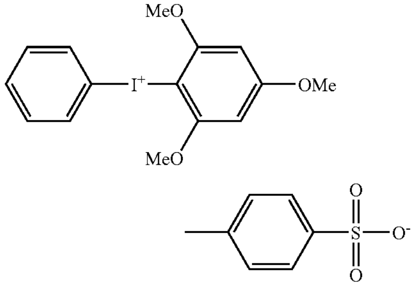

The iodonium salt can be added at a ratio of 0.1 to 50 mass %, preferably from 0.5 to 30 mass %, more preferably from 1 to 20 mass %, based on all solid contents constituting the layer to which the iodonium salt is added. Within this range, high visibility and a good printout image are obtained.

(C) Radical-Polymerizable Compound

The radical-polymerizable compound (hereinafter sometimes simply referred to as a "polymerizable compound") which can be used in the present invention is an addition-polymerizable compound having at least one ethylenically unsaturated double bond and is selected from compounds having at least one, preferably two or more, ethylenically unsaturated bond(s). Such compounds are widely known in this industrial field and these known compounds can be used in the present invention without any particular limitation. These compounds have a chemical mode such as monomer, prepolymer (that is, dimer, trimer or oligomer) or a mixture or copolymer thereof. Examples of the monomer and its copolymer include an unsaturated carboxylic acid (e.g., acrylic acid, methacrylic acid, itaconic acid, crotonic acid, isocrotonic acid, maleic acid), and esters and amides thereof. Among these, preferred are esters of an unsaturated carboxylic acid with an aliphatic polyhydric alcohol compound, and amides of an unsaturated carboxylic acid with an aliphatic polyvalent amine compound. Also, an addition reaction product of an unsaturated carboxylic acid ester or amide having a nucleophilic substituent such as hydroxyl group, amino group or mercapto group with a monofunctional or polyfunctional isocyanate or epoxy, and a dehydrating condensation reaction product with a monofunctional or polyfunctional carboxylic acid may be suitably used. Furthermore, an addition reaction product of an unsaturated carboxylic acid ester or amide having an electrophilic substituent such as isocyanate group or epoxy group with a monofunctional or polyfunctional alcohol, amine or thiol, and a displacement reaction product of an unsaturated carboxylic acid ester or amide having a desorptive substituent such as halogen group or tosyloxy group with a monofunctional or polyfunctional alcohol, amine or thiol may also be suitably used. In addition, compounds where the unsaturated carboxylic acid of the above-described compounds is replaced by an unsaturated phosphonic acid, styrene, vinyl ether or the like, may also be used.

Specific examples of the monomeric ester of an aliphatic polyhydric alcohol compound and an unsaturated carboxylic acid may include, as an acrylic ester, ethylene glycol diacrylate, triethylene glycol diacrylate, 1,3-butanediol diacrylate, tetramethylene glycol diacrylate, propylene glycol diacrylate, neopentyl glycol diacrylate, trimethylol propane triacrylate, trimethylol propane tri(acryloyl oxypropyl)ether, trimethylolethane triacrylate, hexanediol diacrylate, 1,4-cyclohexane diol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyl oxyethyl)isocyanurate, polyester acrylate oligomer, EO-modified isocyanuric triacrylate, or the like.

As a methacrylic ester, mention may be made of tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)phenyl]dimethylmethane or the like.

As an itaconic ester, there are ethylene glycol diitaconate, propylene glycol diitaconate, 1,3-butanediol diitaconate, 1,4-butanediol diitaconate, tetramethylene glycol diitaconate, pentaerytbritol diitaconate, sorbitol tetraitaconate or the like. As a crotonic ester, there are ethylene glycol dicrotonate, tetramethylene glycol dicrotonate, pentaerythritol dicrotonate, sorbitol tetradicrotonate or the like. As an isocrotonic ester, there are ethylene glycol diisocrotonate, pentaerythritol diisocrotonate, sorbitol tetraisocrotonate or the like. As a maleic ester, mention may be made of ethylene glycol dimalate, triethylene glycol dimalate, pentaerythritol dimalate, sorbitol tetramalate or the like.

Other examples of such ester that are also very appropriately used include, for example, the aliphatic alcohol-based esters as described in JP-B No. 51-47334 or JP-A No. 57-196231, those having the aromatic skeleton as described in JP-A No. 59-5240, 59-5241 or 2-226149, or those containing amino groups as described in JP-A No. 1-165613. Further, the above-described monomeric esters may be also used as mixtures.

Specific examples of the monomeric amide of an aliphatic polyvalent amine compound and of an unsaturated carboxylic acid may include methylenebis-acrylamide, methylenebis-methacrylamide, 1,6-hexamethylenebis-acrylamide, 1,6-hexamethylenebis-methacrylamide, diethylenetriamine trisacrylamide, xylylenebis acrylamide, xylylenebis methacrylamide and the like. Other preferred examples of such amide-based monomer may include those having the cyclohexylene structure as described in JP-B No. 54-21726.

Further, also preferred is the urethane-based addition-polymerizable compounds prepared from the addition reaction between an isocyanate group and a hydroxyl group, and specific examples thereof may include, for example, the vinyl urethane compounds containing two or more polymerizable vinyl groups in a molecule, which are prepared by adding a vinyl monomer containing a hydroxyl group as represented by the following Formula (a), to a polyisocyanate compound having two or more isocyanate groups in a molecule as described in JP-B No. 48-41708, and the like:

$$CH_2{=}C(R_4)COOCH_2CH(R_5)OH \quad (a)$$

wherein $R_4$ and $R_5$ represent H or $CH_3$.

In addition, also preferred are the urethane acrylates as described in JP-A No. 51-37193, JP-B Nos. 2-32293 and 2-16765, or the compounds having the ethylene oxide-based structure as described in JP-B Nos. 58-49860, 56-17654, 62-39417 and 62-39418. Moreover, the use of the addition-polymerizable compounds having an amino structure or a sulfide structure in the molecule as described in JP-A Nos. 63-277653, 63-260909 and 1-105238 can result in a photo-polymerizable composition with an excellent photosensitization speed.

Other examples may include polyfunctional acrylates or methacrylates such as the polyester acrylates, the epoxy acrylates resulting from a reaction between an epoxy resin and a (meth)acrylic acid, or the like, as respectively described in JP-A No. 48-64183, JP-B Nos. 49-43191 and 52-30490. Mention may be also made of the specific unsaturated compounds described in JP-B Nos. 46-43946, 1-40337 and 1-40336, the vinylphosphonic acid-based compounds described in JP-A No. 2-25493, or the like. In some cases, the structure containing a perfluoroalkyl group as described in JP-A No. 61-22048 may be appropriately used. Furthermore, use can be made of those introduced as photocurable monomers and oligomers in the Journal of the Adhesion Society of Japan, Vol. 20, No. 7, p. 300-308 (1984).

For these addition-polymerizable compounds, the details of the method of using them such as the compound structure, individual or combined use, the amount of addition or the like may be arbitrarily determined according to the final performance design for the lithographic printing plate precursor. For example, the terms are selected in the following aspects.

In the aspect of sensitivity, a structure having a high content of unsaturations per molecule is preferred, and in most cases, a functionality of two or more is preferred. Also, in order to increase the strength of the image area, namely, the cured film, a functionality of three or more is preferred, and also effective is the method of balancing between the sensitivity and the strength by using compounds with different functionalities or different polymerizable groups (for example, acrylic esters, methacrylic esters, styrene-based compounds, vinyl ether-based compounds) in combination.

Further, in the aspect of compatibility and dispersibility with the other components in the image recording layer (for example, a binder polymer, an initiator, a coloring agent, etc.), the selection and the use of addition-polymerizable compounds are important factors, and in certain cases, compatibility can be improved by, for example, the use of low purity compounds or the combined use of two or more compounds. Selection of a specific structure under the purpose of improving the close adherence to the substrate or to the overcoat layer, etc. described later is also possible.

The polymerizable compounds are used preferably in a range of 5 to 80% by mass, and more preferably 25 to 75% by mass, with respect to the involatile components in the image recording layer. Further, these compounds may be used either alone or in combination of two or more species. Other aspects in the method of using the addition-polymerizable compounds are such that the structure, the blending and the amount of addition can be appropriately selected from the viewpoint of the extent of polymerization inhibition according to oxygen, resolution, clouding, change in the refractive index, surface adhesiveness or the like. Moreover, if appropriate, the techniques of layer construction and coating as referred to as undercoating and overcoating may be also performed.

(D) Compound of Changing in Color Under Action of Radical

In the present invention, as for the compound of changing in the color under the action of a radical, a conventionally known leuco dye may be arbitrarily used. Specific preferred examples of the leuco dye include aminotriarylmethanes such as bis(4-dimethylaminophenyl)phenylmethane (also called leuco Malachite Green), bis(4-diethylamino-o-tolyl)(o-chlorophenyl)methane, tris(4-diethylamino-o-tolyl)methane, tris(p-dimethylaminophenyl)methane (also called leuco Crystal Violet), tris(p-dihexylaminophenyl)methane, bis(4-diethylamino-o-tolyl)(3,4-dimethoxyphenyl)methane, bis(4-diethylamino-o-tolyl)(p-benzylthiophenyl)methane and bis(p-dimethylamino-o-tolyl)(p-α-methoxyacetamide)methane; aminoxanthenes such as 3,6-bis(diethylamino)-9-phenylxanthene and 3-amino-6-dimethylamino-2-methyl-9-(o-chlorophenyl)xanthene; aminothioxanthenes such as 3,6-bis(diethylamino)-9-(o-ethoxycarbonylphenyl)thioxanthene and 3,6-bis(dimethylamino)thioxanthene; amino-9,10-dihydroacridines such as 3,6-bis(diethylamino)-9,10-dihydro-9-phenylacridine, 3,6-bis-(benzylamino)-9,10-dihydro-9-methylacridine; aminophen-oxazines such as 3,7-bis(diethylamino)phenoxazine; aminophenothiazines such as 3,7-bis(ethylamino)phenothiazine; aminodihydrophenazines such as 3,7-bis(diethylamino)-5-hexyl-5,10-dihydrophenazine; aminodiphenylmethanes such as bis(p-dimethylaminophenyl)anilinomethane; leuco indamines such as 4-amino-4'-dimethylaminodiphenylamine; aminohydrocinnamic acids such as methyl 4-amino-α,β-dicyanohydrocinnamate; hydrazines such as 1-(2-naphthyl)-2-phenylhydrazine; amino-2,3-dihydroanthraquinones such as 1,4-bis(ethylamino)-2,3-dihydroanthraquinone; and phenethylanilines such as N,N-diethyl-p-phenethylaniline.

Among these leuco dyes, preferred are aminotriarylmethanes, more preferred are those where at least two aryl groups have an amino group at the para-position with respect to the bond to the methane carbon atom, still more preferred are those where three aryl groups all have an amino group at the para-position. Also, amino-triarylmethanes having an alkyl group, an alkoxy group or a halogeno atom at the ortho-position of the aryl group are preferred because of excellent storage stability.

In the present invention, the content of the compound of changing in the color under the action of a radical is from 0.1 to 25 mass %, preferably from 1 to 20 mass %, more preferably from 5 to 15 mass %, based on the solid content of the layer to which this compound is added.

The ratio of the compound of changing in the color under the action of a radical to the radical polymerization initiator is, on a mol basis, [compound of changing in the color under the action of a radical]/[radical polymerization initiator]= from 0.1 to 2.5, preferably from 0.4 to 2.0, more preferably from 0.8 to 1.5.

In the present invention, when the compound of changing in the color under the action of a radical used has an amino group or a substituted amino group in the compound structure as in aminotriarylmethanes, an acidic substance capable of forming an ammonium salt, such as mineral acid, organic acid or so-called Lewis acid, is preferably added. The color formation is promoted by the addition of an acidic substance. Representative examples of the acidic substance include hydrochloric acid, hydrobromic acid, sulfuric acid, phosphoric acid, acetic acid, oxalic acid, sulfonic acids such as p-toluenesulfonic acid, trichloroacetic acid, trifluoroacetic acid, halogen-substituted carboxylic acids such as perfluoroheptanoic acid, zinc chloride, zinc bromide and iron chloride. The amount of the acidic substance used is usually from 0.1 to 2.0 mol, preferably from 0.5 to 1.5 mol, per mol of the amino group.

(E) Other Additives

<Radical-Polymerization Initiator>

In the lithographic printing plate precursor of the present invention, a radical-polymerization initiator can be used.

The radical-polymerization initiator for use in the present invention is a compound of generating a radical by the effect of light or heat energy or both energies. The radical-polymerization initiator has a function of forming a printout image in combination with the above-described compound of changing in the color under the action of a radical. Also, when used in combination with a radical-polymerizable compound described later, the radical-polymerization initiator has a function of initiating or accelerating the polymerization of the compound having a polymerizable unsaturated group.

Examples of the radical-polymerization initiator which can be used in the present invention include known thermopolymerization initiators, compounds having a bond with a small bond-dissociation energy, photopolymerization initiators, and radical generators called a photooxidant or a printing-out agent. Among these, the radical-polymerization initiator suitably used in the present invention is a compound of generating a radical by the effect of heat energy.

The radical-polymerization initiator for use in the present invention is described in detail below. One of these radical-polymerization initiators may be used alone or two or more thereof may be used in combination.

Such radical polymerization initiator may include, for example, an organic halogen compound, a carbonyl compound, organic peroxides, an azo-based compound, an azide compound, a metallocene compound, a hexaaryl biimidazole compound, an organic boron compound, a disulfone compound, an oxime ester compound and an onium salt compound.

As the organic halogen compound, mention may be made specifically of the compounds described in Wakabayashi, et al., "Bull. Chem. Soc. Japan" 42, 2924 (1969), U.S. Pat. No. 3,905,815, JP-B No. 46-4605, JP-A Nos. 48-36281, 53-133428, 55-32070, 60-239736, 61-169835, 61-169837, 62-58241, 62-212401, 63-70243 and 63-298339, and M. P. Hutt, "Journal of Heterocyclic Chemistry" 1(No. 3), (1970). Among these, the oxazole compounds with substituted trihalomethyl group and s-triazine compounds are very appropriate.

More preferably, mention may be made of the s-triazine derivatives in which at least one mono-, di- or trihalogen-substituted methyl group is attached to the s-triazine ring, specifically for example, 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-($\alpha$,$\alpha$,$\beta$-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyl oxystyryl)-4,6-bis(trichloromethyl)-s-triazine, 2-(p-tolyl)-4,6-bis(trichloromethyl)-s-triazine, 2-(4-nathoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, or the like.

As the carbonyl compound, mention may be made of benzophenone derivatives such as benzophenone, Michler's ketone, 2-methylbenzophenone, 3-methylbenzophenone, 4-methylbenzophenone, 2-chlorobenzophenone, 4-bromobenzophenone, 2-carboxybenzophenone or the like; acetophenone derivatives such as 2,2-dimethoxy-2-phenylacetophenone, 2,2-diethoxyacetophenone, 1-hydroxy cyclohexylphenyl ketone, $\alpha$-hydroxy-2-methylphenyl propanone, 1-hydroxy-1-methylethyl-(p-isopropylphenyl) ketone, 1-hydroxy-1-(p-dodecylphenyl) ketone, 2-methyl-(4'-(methylthio)phenyl)-2-morpholino-1-propanone, 1,1,1-trichloromethyl-(p-butylphenyl) ketone or the like; thioxantone derivatives such as thioxantone, 2-ethyl thioxantone, 2-isopropyl thioxantone, 2-chlorothioxantone, 2,4-dimethyl thioxantone, 2,4-diethyl thioxantone, 2,4-diisopropyl thioxantone or the like; and benzoic ester derivatives such as ethyl p-dimethylaminobenzoic acid ester, ethyl p-diethylaminobenzoic acid ester or the like.

As the azo-based compound, for example the azo compounds and the like described in JP-A No. 8-108621 can be used.

As the organic peroxide, mention may be made of, for example, trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropylene benzene hydroperoxide, 2,5-dimethylhexane-2,5-dihydroperoxide, 1,1,3,3-tetramethylbutylhydroperoxide, tert-butylcumylperoxide, dicumylperoxide, 2,5-dimethyl-2,5-di(tert-butylperoxy)hexane, 2,5-oxanoyl peroxide, succinic acid peroxide, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxydicarbonate, di-(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxylaurate, tosyl carbonate, 3,3',4,4'-tetra(t-butyl peroxycarbonyl)benzophenone, 3,3',4,4'-tetra(t-hexyl peroxycarbonyl) benzophenone, 3,3',4,4'-tetra(p-isopropylcumyl peroxycarbonyl)benzophenone, carbonyl di(t-butylperoxy dihydrogen diphthalate), carbonyl di(t-hexylperoxy dihydrogen diphthalate) or the like.

As the metallocene compound, mention may be made of the various titanocene compounds as described in JP-A Nos. 59-152396, 61-151197, 63-41484, 2-249, 2-4705 and 5-83588, for example, di-cyclopentadienyl-Ti-bis-phenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicylcopentadienyl-Ti-bis-2,3,5,6-tetrafluorophen-1-yl, dicylcopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl, the iron-arene complex described in JP-A Nos. 1-304453 and 1-152109, or the like.

As the hexaaryl biimidazole compound, mention may be made of, for example, various compounds described in JP-B No. 6-29285 and U.S. Pat. Nos. 3,479,185, 4,311,783 and 4,622,286, in particular, 2,2'-bis(o-chlorophenyl)-4,4',5,5'-tetraphenyl biimidazole, 2,2'-bis(o-bromophenyl)-4,4'-5,5'- tetraphenyl biimidazole, 2,2'-bis(o,p-dichlorophenyl)-4,4',5,5'-tetraphenyl biimidazole, 2,2'-bis(o-chlorophenyl)-4,4',5,5'-tetra(m-methoxyphenyl) biimidazole, 2,2'-bis(o,o-dichlorophenyl)-4,4',5,5'-tetraphenyl biimidazole, 2,2'-bis(o-nitrophenyl)-4,4',5,5'-tetraphenyl biimidazole, 2,2'-bis(o-methylphenyl)-4,4',5,5'-tetraphenyl biimidazole, 2,2'-bis(o-trifluorophenyl)-4,4',5,5'-tetraphenyl biimidazole or the like.

As the organic boron compound, mention may be made of, for example, the organic boric acid salts as described in JP-A Nos. 62-143044, 62-150242, 9-188685, 9-188686, 9-188710, 2000-131837 and 2002-107916, Japanese Patent No. 2764769, JP-A No. 2002-116539 and Kunz, Martin, “Rad Tech’ 98. Proceeding Apr. 19-22, 1998, Chicago” and the like; the organic boron-sulfonium complexes or the organic boron-oxosulfonium complexes as described in JP-A Nos. 6-157623, 6-175564 and 6-175561; the organic boron-iodonium complexes as described in JP-A Nos. 6-175554 and 6-175553; the organic boron-phosphonium complexes as described in JP-A No. 9-188710, the organic boron-transition metal coordination complexes as described in JP-A Nos. 6-348011, 7-128785, 7-140589, 7-306527 and 7-292014; or the like.

As the disulfone compounds, mention may be made of, the compounds as described in JP-A Nos. 61-166544 and 2002-328465, and the others.

As the oxime ester compound, mention may be made of the compounds described in J. C. S. Perkin II (1979) 1653-1660, J. C. S. Perkin II (1979) 156-162, Journal of Photopolymer Science and Technology (1995) 202-232 and in JP-A No. 2000-66385, the compounds described in JP-A No. 2000-80068, and specifically the compounds represented by the following structural formulae:

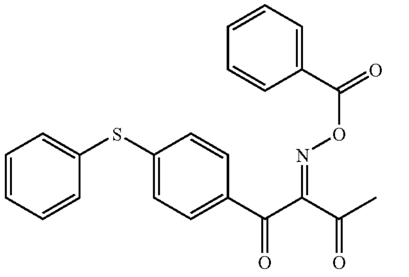

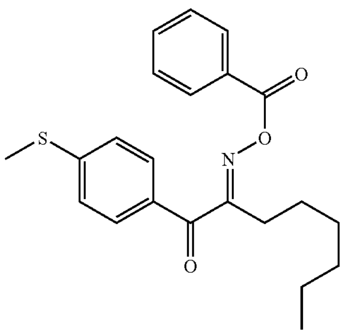

-continued

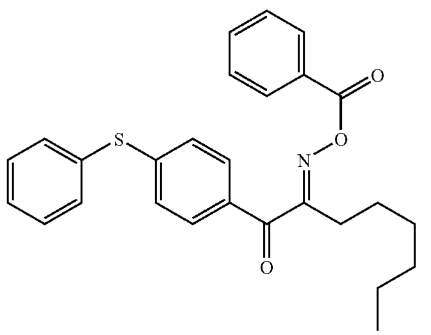

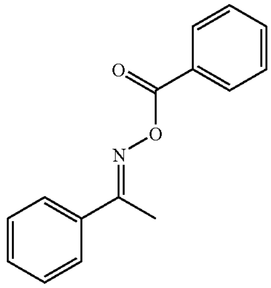

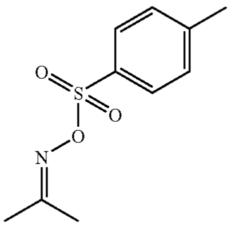

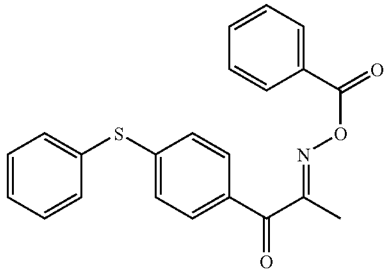

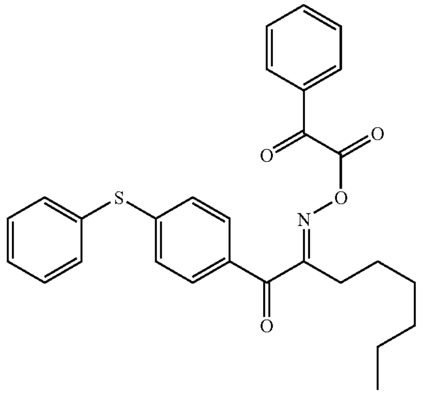

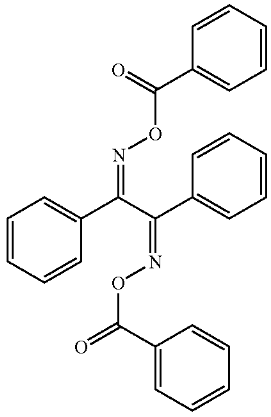

-continued
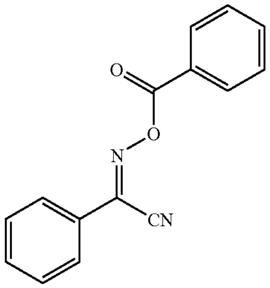
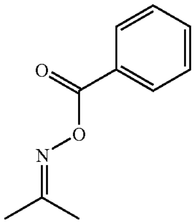
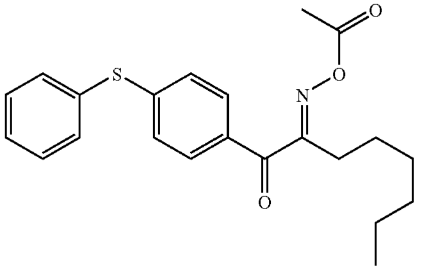
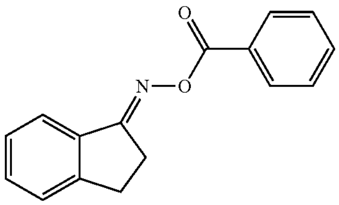
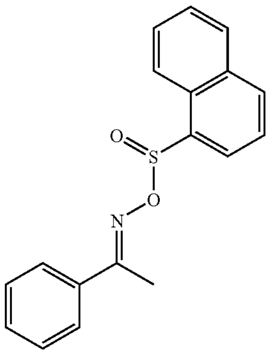
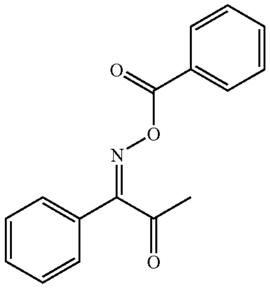
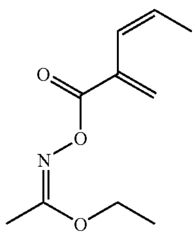
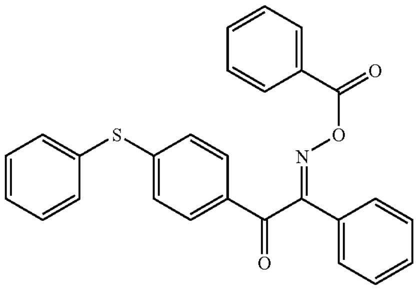
-continued
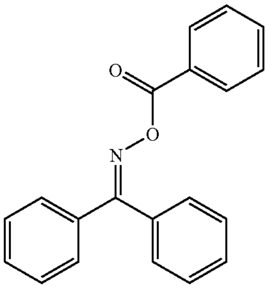
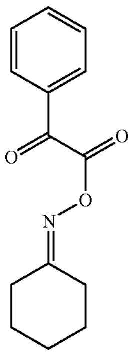
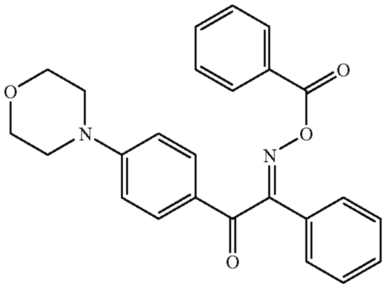
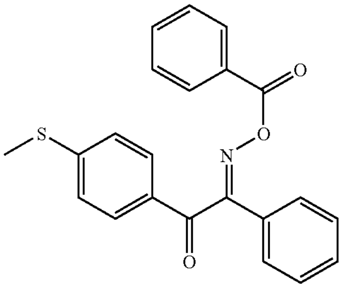
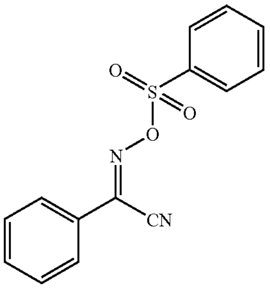
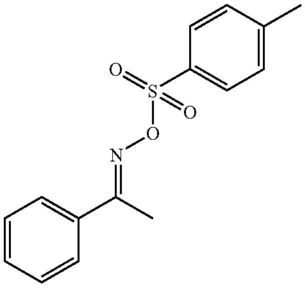
As the onium salt compound, mention may be made of, for example, the diazonium salts as described in S. I. Schlesinger, Photogr. Sci. Eng., 18, 387(1974) and T. S. Bal et al., Polymer, 21, 423 (1980); the ammonium salts as described in U.S. Pat. No. 4,069,055, JP-A No. 4-365049 or the like; the phosphonium salts as described in U.S. Pat. Nos. 4,069,055 and 4,069,056; the iodonium salts as described in EP No. 104, 143, U.S. Pat. Nos. 339,049 and 410,201 and JP-A Nos.

2-150848 and 2-296514; the sulfonium salts as described in EP No. 370,693, 390, 214, 233, 567, 297,443 and 297,442, U.S. Pat. Nos. 4,933,377, 161, 811, 410, 201, 339,049, 4,760, 013, 4,734,444 and 2,833,827, DE Nos. 2,904,626, 3,604,580 and 3,604,581; the celenonium salt as described in J. V. Crivello et al., Macromolecules, 10(6), 1307 (1977) and J. V. Crivello et al., J. Polymer Sci., Polymer Chem. Ed., 17, 1047 (1979); the arsonium salt as described in C. S. Wen et al., Teh Proc. Conf. Rad. Curing ASIA, p. 478, Tokyo, October (1988); or the like.

In particular, from the viewpoints of reactivity and stability, the oxime ester compounds or the onium salts (diazonium salts, iodonium salts or sulfonium salts) may be favorably mentioned.

The onium salts used favorably in the invention are the onium salts represented by the following formulae (RI-I) to (RI-III):

(RI-I)

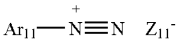

(RI-II)

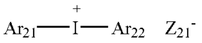

(RI-III)

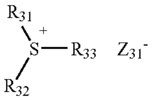

In Formula (RI-I), $Ar_{11}$ represents an aryl group having up to 20 carbon atoms and optionally 1 to 6 substituents, and the preferred substituents may include an alkyl group having 1 to 12 carbon atoms, an alkenyl group having 1 to 12 carbon atoms, an alkynyl group having 1 to 12 carbon atoms, an aryl group having 1 to 12 carbon atoms, an alkoxy group having 1 to 12 carbon atoms, an aryloxy group having 1 to 12 carbon atoms, a halogen atom, an alkylamino group having 1 to 12 carbon atoms, a dialkylamino group having 1 to 12 carbon atoms, an alkylamide group or an arylamide group having 1 to 12 carbon atoms, a carbonyl group, a carboxyl group, a cyano group, a sulfonyl group, a thioalkyl group having 1 to 12 carbon atoms, and a thioaryl group having 1 to 12 carbon atoms. $Z_{11}^-$ represents a monovalent anion and specific examples thereof may include a halogen ion, a perchlorate ion, a hexafluorophosphate ion, a tetrafluoroborate ion, a sulfonate ion, a sulfinate ion, a thiosulfonate ion and a sulfate ion. Among these, a perchlorate ion, a hexafluorophosphate ion, a tetrafluoroborate ion, a sulfonate ion and a sulfinate ion are preferred in terms of stability.

In Formula (RI-II), $Ar_{21}$ and $Ar_{22}$ each independently represent an aryl group having up to 20 carbon atoms and optionally 1 to 6 substituents, and the preferred substituents may include an alkyl group having 1 to 12 carbon atoms, an alkenyl group having 1 to 12 carbon atoms, an alkynyl group having 1 to 12 carbon atoms, an aryl group having 1 to 12 carbon atoms, an alkoxy group having 1 to 12 carbon atoms, an aryloxy group having 1 to 12 carbon atoms, a halogen atom, an alkylamino group having 1 to 12 carbon atoms, a dialkylamino group having 1 to 12 carbon atoms, an alkylamide group or an arylamide group having 1 to 12 carbon atoms, a carbonyl group, a carboxyl group, a cyano group, a sulfonyl group, a thioalkyl group having 1 to 12 carbon atoms, and a thioaryl group having 1 to 12 carbon atoms. $Z_{21}$- represents a monovalent anion, and specific examples thereof may include a halogen ion, a perchlorate ion, a hexafluorophosphate ion, a tetrafluoroborate ion, a sulfonate ion, a sulfinate ion, a thiosulfonate ion and a sulfate ion. Among these, a perchlorate ion, a hexafluorophosphate ion, a tetrafluoroborate ion, a sulfonate ion, a sulfinate ion and a carboxylate ion are preferred in terms of stability and reactivity.

In Formula (RI-III), $R_{31}$, $R_{32}$ and $R_{33}$ each independently represent an aryl, alkyl, alkenyl or alkynyl group having up to 20 carbon atoms and optionally 1 to 6 substituents, and the preferred substituents may include an alkyl group having 1 to 12 carbon atoms, an alkenyl group having 1 to 12 carbon atoms, an alkynyl group having 1 to 12 carbon atoms, an aryl group having 1 to 12 carbon atoms, an alkoxy group having 1 to 12 carbon atoms, an aryloxy group having 1 to 12 carbon atoms, a halogen atom, an alkylamino group having 1 to 12 carbon atoms, a dialkylamino group having 1 to 12 carbon atoms, an alkylamide group or an arylamide group having 1 to 12 carbon atoms, a carbonyl group, a carboxyl group, a cyano group, a sulfonyl group, a thioalkyl group having 1 to 12 carbon atoms, and a thioaryl group having 1 to 12 carbon atoms. $Z_{31}$-represents a monovalent anion, and specific examples thereof may include a halogen ion, a perchlorate ion, a hexafluorophosphate ion, a tetrafluoroborate ion, a sulfonate ion, a sulfinate ion, a thiosulfonate ion and a sulfate ion. Among these, a perchlorate ion, a hexafluorophosphate ion, a tetrafluoroborate ion, a sulfonate ion, a sulfinate ion and a carboxylate ion are preferred in terms of stability and reactivity. More preferred is the carboxylate ion as described in JP-A No. 2001-343742, and particularly preferred is the carboxylate ion as described in JP-A No. 2002-148790.

Specific examples of the compounds represented by the above formulae (RI-I) to (RI-III) are presented below, but they are not intended to limit the invention.

(N-1)

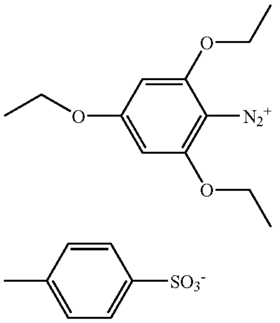

(N-2)

$PF_6^-$ (N-3)

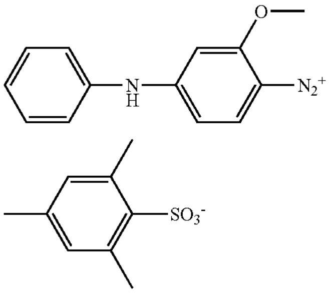

(N-4)

$ClO_4^-$

-continued
(N-5)
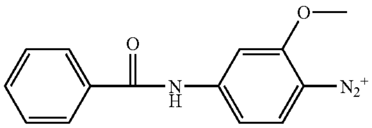
$CF_3SO_3^-$
(N-6)
$BF_4^-$
(N-7)
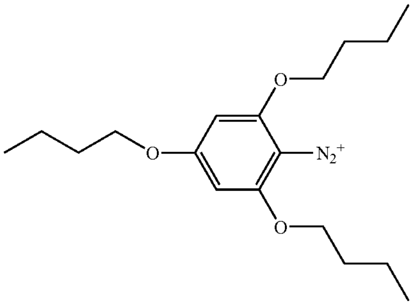
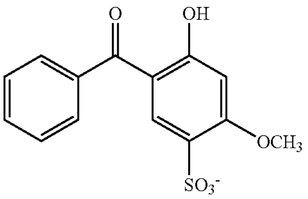
(N-8)
$ClO_4^-$
(N-9)
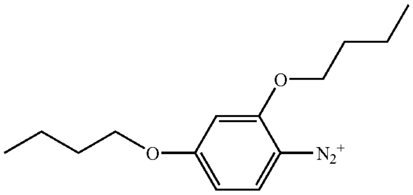
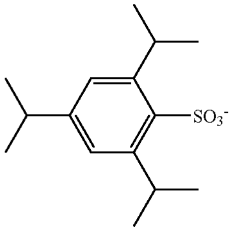
(N-10)
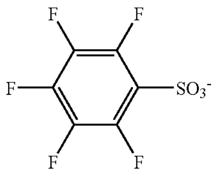
(N-11)
$PF_6^-$
-continued
(N-12)
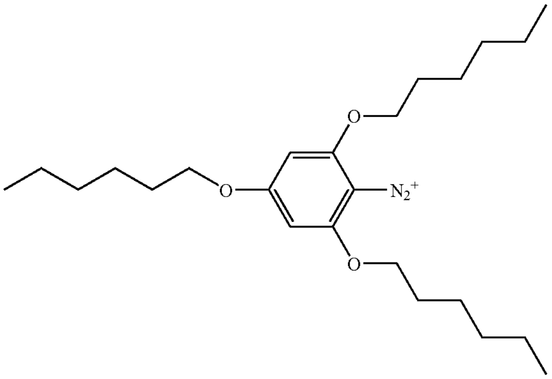
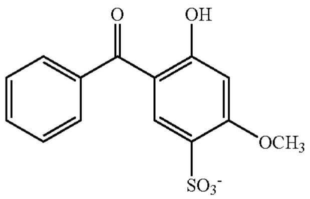
(N-13)
$ClO_4^-$
(N-14)
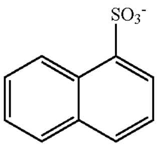
(I-1)
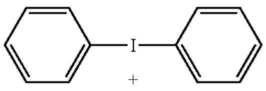
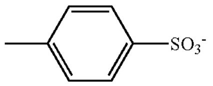
(I-2)
$PF_6^-$
(I-3)
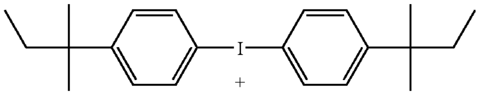
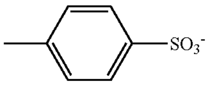
(I-4)
$ClO_4^-$
(I-5)
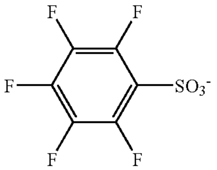
(I-6)
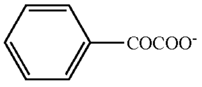
(I-7)
$CF_3SO_3^-$ -continued
(I-8)
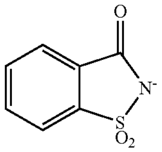
(I-9)
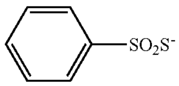
(I-10)
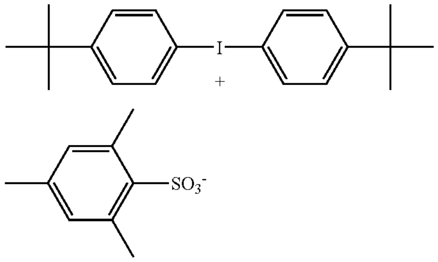
(I-11)
$ClO_4^-$
(I-12)
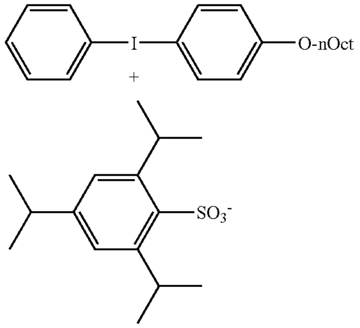
(I-13)
$CF_3COO^-$
(I-14)
$CF_3SO_3^-$
(I-15)
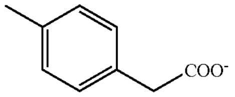
(I-16)
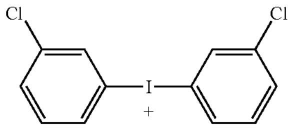
$BF_4^-$
(I-17)
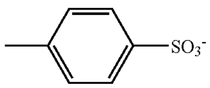
(I-18)
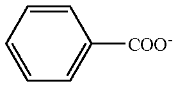
-continued
(S-1)
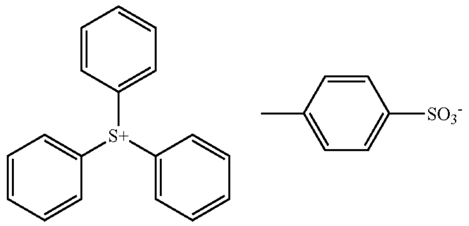
(S-2)
$PF_6^-$
(S-3)
$ClO_4^-$
(S-4)
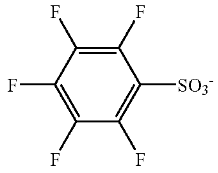
(S-5)
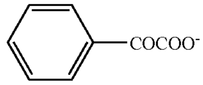
(S-6)
$CF_3SO_3^-$
(S-7)
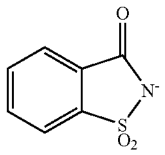
(S-8)
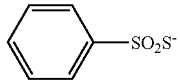
(S-9)
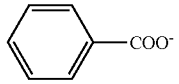
(S-10)
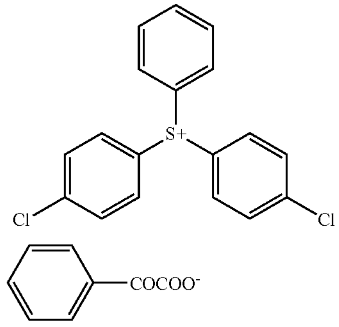
(S-11)
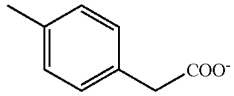

-continued (S-12)

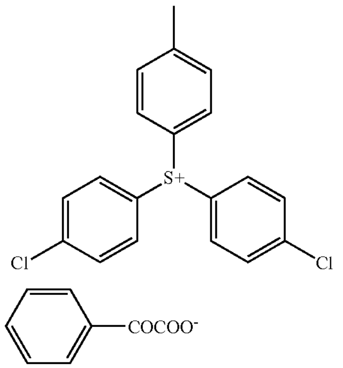

(S-13)

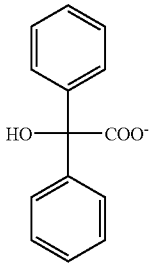

(S-14)

$BF_4^-$ (S-15)

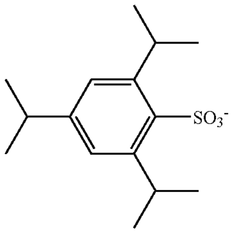

Particularly, the radical-polymerization initiator for use in the present invention is preferably a compound represented by the following formula (I) because of its excellent sensitivity.

(I)

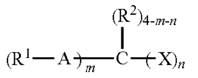

In formula (I), X represents a halogen atom and specific examples thereof include a fluorine atom, a chlorine atom, a bromine atom and an iodine atom. Among these, preferred are a chlorine atom and a bromine atom because of their excellent sensitivity, and more preferred is a bromine atom.

A represents a divalent linking group selected from the group consisting of —CO—, —SO—, $—SO_2—$, —PO— and $—PO_2—$. Among these, preferred are —CO—, —SO— and $—SO_2—$, and more preferred are —CO— and $—SO_2$.

$R^1$ and $R^2$ each independently represents a hydrogen atom or a monovalent hydrocarbon group having from 1 to 20 carbon atoms.

Examples of the hydrocarbon constituting the hydrocarbon group include hydrocarbons described in paragraphs (0013) and (0014) of JP-A-2002-162741. Specific examples of the hydrocarbon include an aliphatic hydrocarbon having from 1 to 30 carbon atoms, such as methane, ethane, propane, butane, hexane, nonane, decane, octadecane, cyclopentane, cyclohexane, adamantane, norbornane, decahydronaphthalene, tricyclo[5.2.1.$0^{2,6}$]decane, ethylene, propylene, 1-butene, 1-hexene, 1-heptadecene, 2-butene, 2-hexene, 4-nonene, 7-tetradecene, butadiene, piperylene, 1,9-decadiene, cyclopentene, cyclohexene, cyclooctene, 1,4-cyclohexadiene, 1,5-cyclooctadiene, 1,5,9-cyclododecatriene, norbornylene, octahydronaphthalene, bicyclo[2.2.1]hepta-2,5-diene, acetylene, 1-propyne and 2-hexyne; and an aromatic hydrocarbon such as benzene, naphthalene, anthracene, indene and fluorene.

The carbon atom constituting such a hydrocarbon group may be substituted by one or more heteroatom(s) selected from an oxygen atom, a nitrogen atom and a sulfur atom.

Examples of the substituent include a monovalent nonmetallic atom group excluding hydrogen, such as halogen atom (e.g., —F, —Br, —Cl, —I), hydroxyl group, alkoxy group, aryloxy group, mercapto group, alkylthio group, arylthio group, alkyldithio group, aryldithio group, amino group, N-alkylamino group, N,N-dialkylamino group, N-arylamino group, N,N-diarylamino group, N-alkyl-N-arylamino group, acyloxy group, carbamoyloxy group, N-alkylcarbamoyloxy group, N-arylcarbamoyloxy group, N,N-dialkylcarbamoyloxy group, N,N-diarylcarbamoyloxy group, N-alkyl-N-arylcarbamoyloxy group, alkylsulfoxy group, arylsulfoxy group, acylthio group, acylamino group, N-alkylacylamino group, N-arylacylamino group, ureido group, N'-alkylureido group, N',N'-dialkylureido group, N'-arylureido group, N',N'-diarylureido group, N'-alkyl-N'-arylureido group, N-alkylureido group, N-arylureido group, N'-alkyl-N-alkylureido group, N'-alkyl-N-arylureido group, N',N'-dialkyl-N-alkylureido group, N',N'-dialkyl-N-arylureido group, N'-aryl-N-alkylureido group, N'-aryl-N-arylureido group, N',N'-diaryl-N-alkylureido group, N',N'-diaryl-N-arylureido group, N'-alkyl-N'-aryl-N-alkylureido group, N'-alkyl-N'-aryl-N-arylureido group, alkoxycarbonylamino group, aryloxycarbonylamino group, N-alkyl-N-alkoxycarbonylamino group, N-alkyl-N-aryloxycarbonylamino group, N-aryl-N-alkoxycarbonylamino group, N-aryl-N-aryloxycarbonylamino group, formyl group, acyl group, carboxyl group and its conjugate base group, alkoxycarbonyl group, aryloxycarbonyl group, carbamoyl group, N-alkylcarbamoyl group, N,N-dialkylcarbamoyl group, N-arylcarbamoyl group, N,N-diarylcarbamoyl group, N-alkyl-N-arylcarbamoyl group, alkylsulfinyl group, arylsulfinyl group, alkylsulfonyl group, arylsulfonyl group, sulfo group ($—SO_3H$) and its conjugate base group, alkoxysulfonyl group, aryloxysulfonyl group, sulfinamoyl group, N-alkylsulfinamoyl group, N,N-dialkylsulfinamoyl group, N-arylsulfinamoyl group, N,N-diarylsulfinamoyl group, N-alkyl-N-arylsulfinamoyl group, sulfamoyl group, N-alkylsulfamoyl group, N,N-dialkylsulfamoyl group, N-arylsulfamoyl group, N,N-diarylsulfamoyl group, N-alkyl-N-arylsulfamoyl group, N-acylsulfamoyl group and its conjugate base group, N-alkylsulfonylsulfamoyl group ($—SO_2NHSO_2$(alkyl)) and its conjugate base group, N-arylsulfonylsulfamoyl group ($—SO_2NHSO_2$(aryl)) and its conjugate base group, N-alkylsulfonylcarbamoyl group ($—CONHSO_2$(alkyl)) and its conjugate base group, N-arylsulfonylcarbamoyl group ($—CONHSO_2$(aryl)) and its conjugate base group, alkoxysilyl group (—Si(O-alkyl)$_3$), aryloxysilyl group (—Si(O-aryl)$_3$), hydroxysilyl ($—Si(OH)_3$) and its conjugate base group, phosphono group ($—PO_3H_2$) and its conjugate base group, dialkylphosphono group ($—PO_3$(alkyl)$_2$), diarylphosphono group ($—PO_3$(aryl)$_2$), alkylarylphosphono group ($—PO_3$(alkyl)(aryl)), monoalkylphosphono group ($—PO_3H$(alkyl)) and its conjugate base group, monoarylphosphono group ($—PO_3H$(aryl)) and its conjugate base group, phosphonooxy group ($—OPO_3H_2$) and its conjugate base group, dialkylphosphonooxy group ($—OPO_3(alkyl)_2$), diarylphosphonooxy group ($—OPO_3(aryl)_2$), alkylarylphosphonooxy group ($—OPO_3(alkyl)(aryl)$), monoalkyl-phosphonooxy group ($—OPO_3H(alkyl)$) and its conjugate base group, monoarylphosphonooxy group ($—OPO_3H(aryl)$) and its conjugate base group, cyano group, nitro group, dialkylboryl group ($—B(alkyl)_2$), diarylboryl group ($—B(aryl)_2$), alkylarylboryl group ($—B(alkyl)(aryl)$), dihydroxyboryl group ($—B(OH)_2$) and its conjugate base group, alkylhydroxyboryl group ($—B(alkyl)(OH)$) and its conjugate base group, arylhydroxyboryl group ($—B(aryl)(OH)$) and its conjugate base group, aryl group, alkyl group, alkenyl group and alkynyl group. These substituents may combine, if possible, with each other to form a ring or the substituent may combine with the substituting hydrocarbon group to form a ring, and the substituent may be further substituted. Preferred examples of the substituent include a halogen atom, an alkoxy group, an aryloxy group, an alkyl group, an alkenyl group, an alkynyl group and an aryl group.

m and n each represents an integer of 1 to 3, provided that m+n is from 2 to 4. In view of sensitivity, it is preferred that m is 1 and n is 3, or m is 2 and n is 2.

When m and n each is an integer of 2 or more, multiple ($R^1$-A) or multiple X may be the same or different. Also, when m is 1 and n is 1, multiple $R^2$ may be the same or different.

Among the compounds represented by formula (I), compounds represented by the following formulae (II) and (III) are preferred because of excellent visibility.

(II)

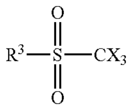

(III)

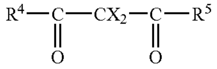

(wherein X has the same meaning as in formula (I), and $R^3$, $R^4$ and $R^5$ each independently represents a monovalent hydrocarbon group having from 1 to 20 carbon atoms).

$R^3$, $R^4$ and $R^5$ each is preferably an aryl group, more preferably an aryl group substituted by an amido group, because of excellent balance between sensitivity and storability. Among these, more preferred is a compound represented by formula (IV):

(IV)

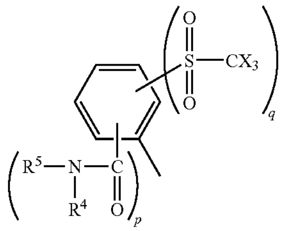

(wherein $R^4$ and $R^5$ each independently represents a hydrogen atom or a monovalent hydrocarbon group having from 1 to 20 carbon atoms, and p and q each represents an integer of 1 to 5, provided that p+q is from 2 to 6).

Specific examples of the radical-polymerization initiator represented by formula (I) include the compounds having a chemical formula shown below and Compound I-3 shown later in Example.

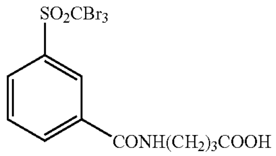

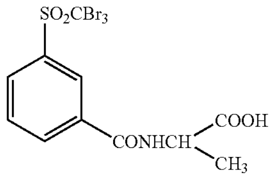

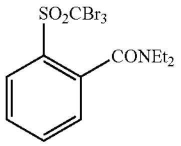

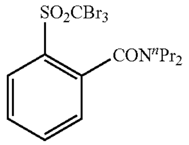

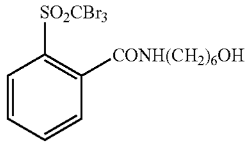

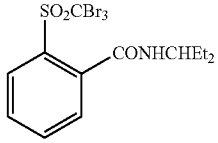

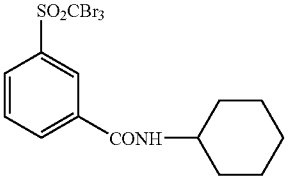

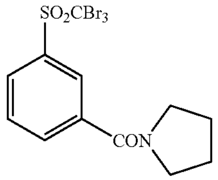

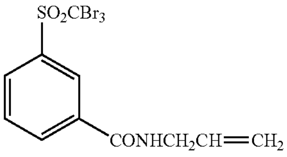

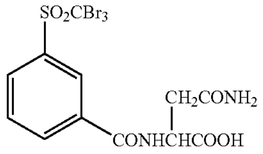

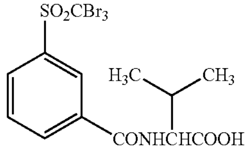

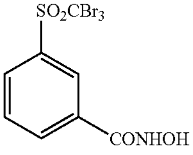

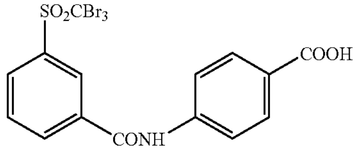

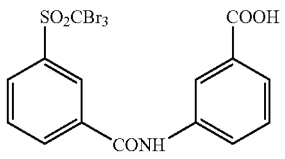

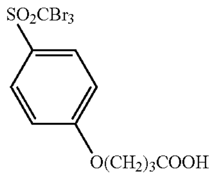

-continued
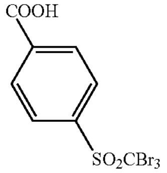
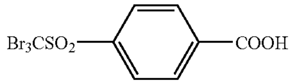
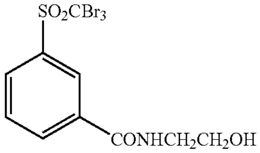
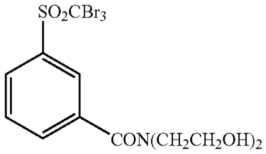
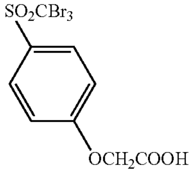
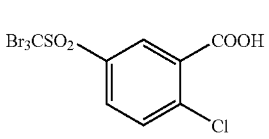
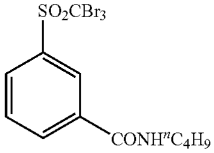
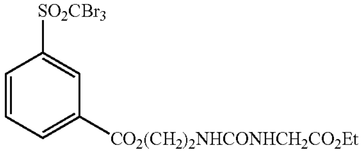
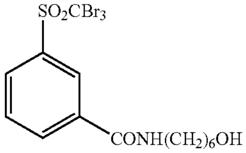
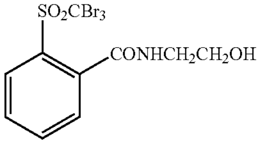
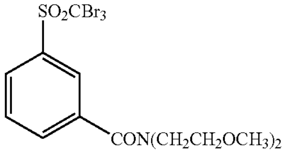
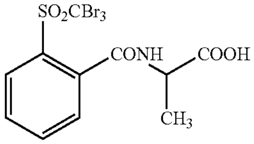
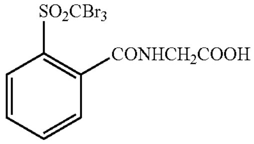
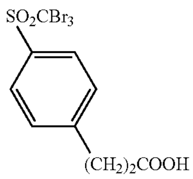
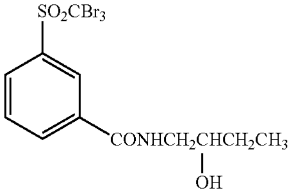
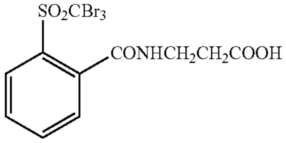
-continued
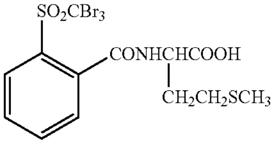
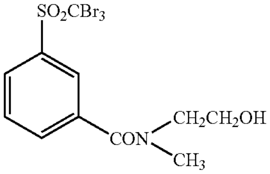
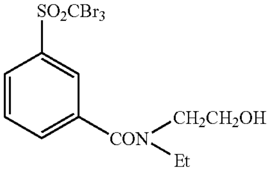
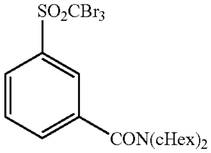
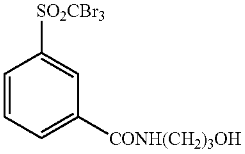
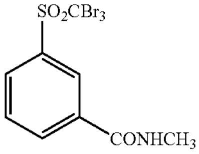
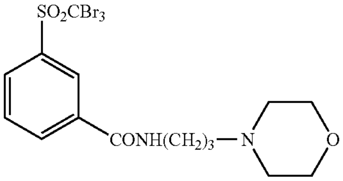
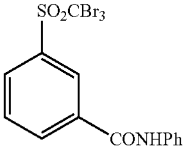
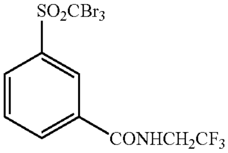
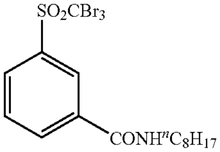
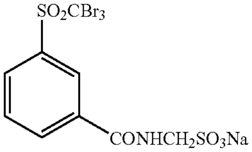
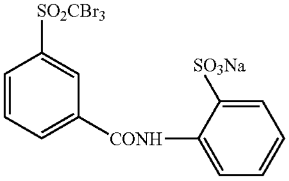
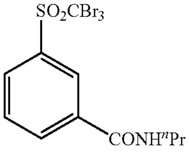
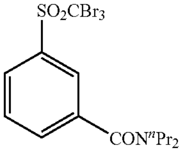
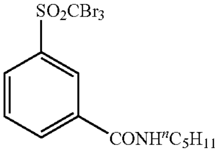
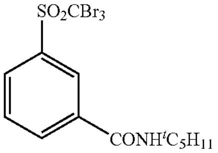
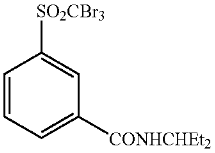

-continued
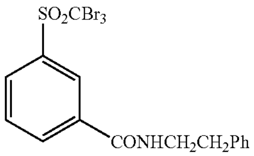
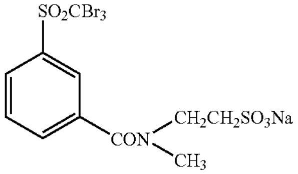
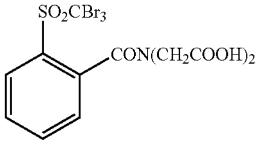
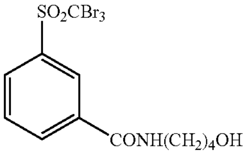
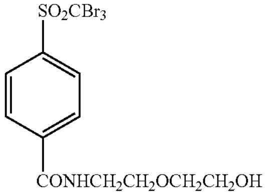
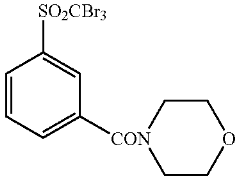
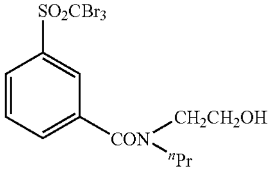
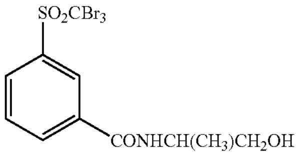
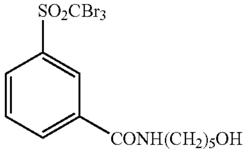
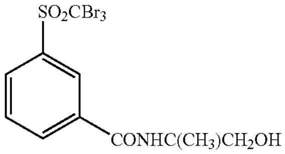
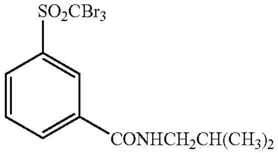
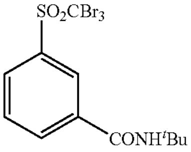
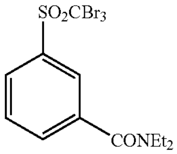
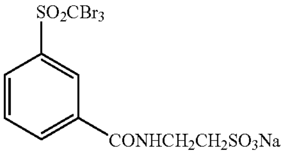
-continued
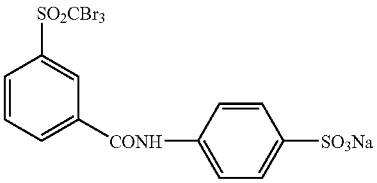
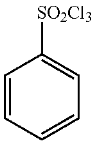
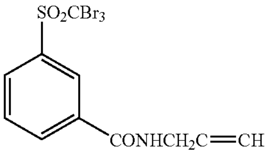
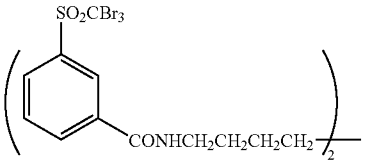
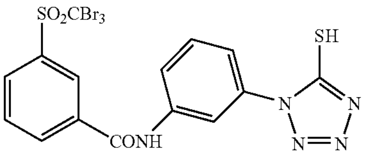
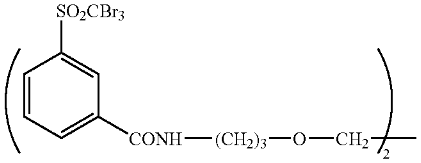
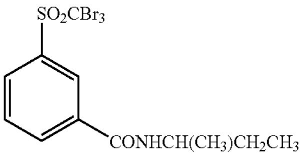
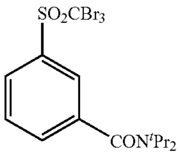
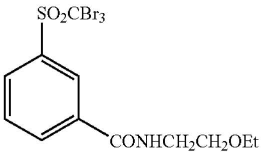
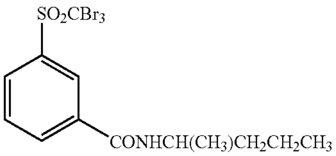
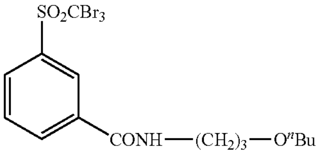
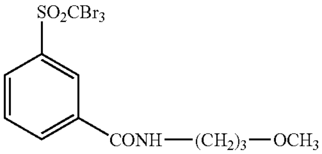

-continued
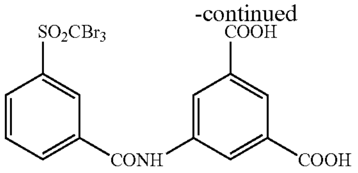
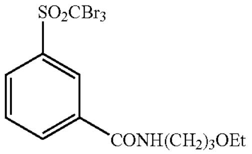
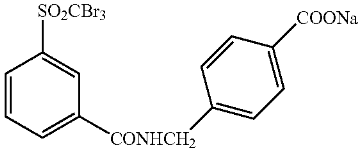
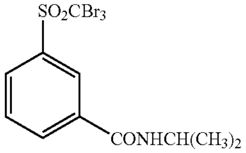
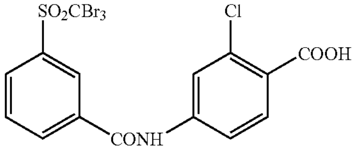
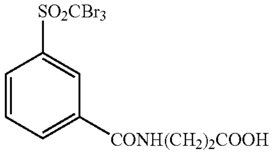
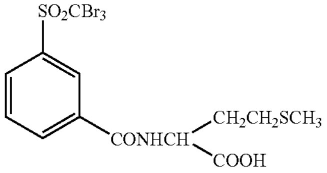
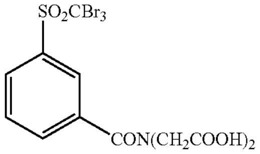
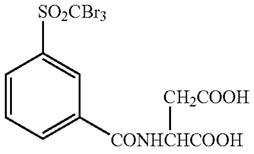
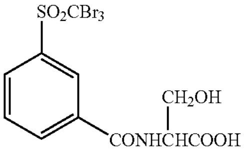
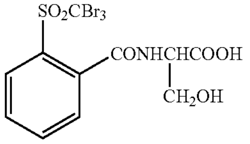
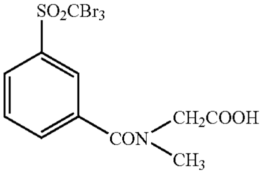
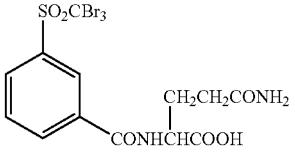
-continued
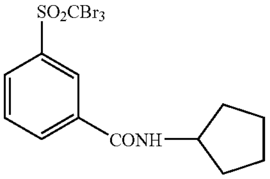
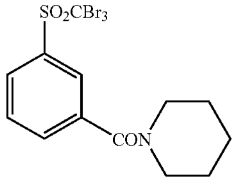
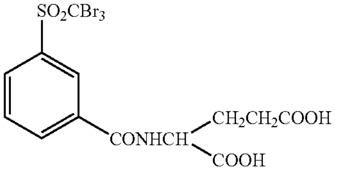
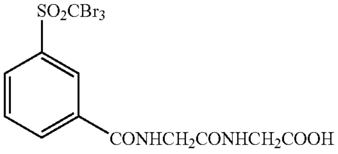
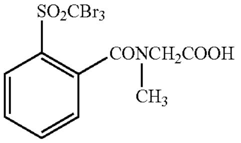
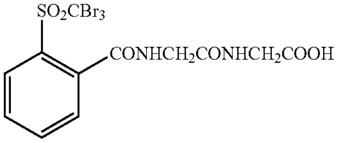
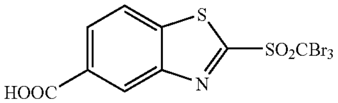
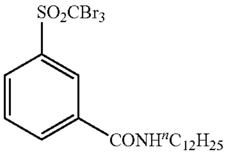
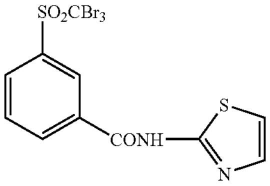
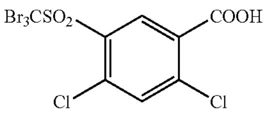
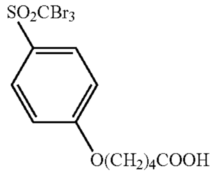
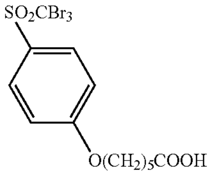
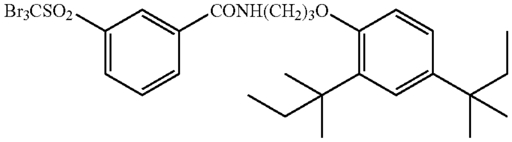
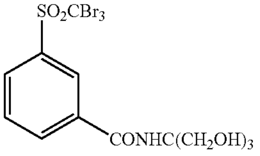

-continued

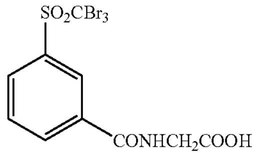

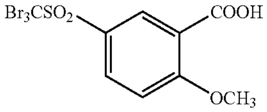

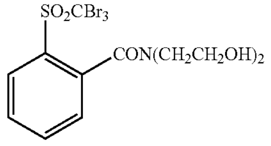

Such a radical-polymerization initiator can be added at a ratio of 0.1 to 50 mass %, preferably from 0.5 to 30 mass %, more preferably from 1 to 20 mass %, based on all solid contents constituting the layer to which the radical-polymerization initiator is added. Within this range, a printout image with good visibility is obtained.

<Binder Polymer>

In the lithographic printing plate precursor of the present invention, a binder polymer can be used. As for the binder polymer which can be used in the present invention, a conventionally known binder polymer can be used without limitation and a linear organic polymer having film property is preferred. Examples of such a binder polymer include acrylic resin, polyvinyl acetal resin, polyurethane resin, polyurea resin, polyimide resin, polyamide resin, epoxy resin, methacrylic resin, polystyrene-based resin, novolak-type phenol-based resin, polyester resin, synthetic rubber and natural rubber.

The binder polymer preferably has crosslinkability for improving the film strength of the image area. In order to impart crosslinkability to the binder polymer, it is preferable to introduce a crosslinkable functional group such as ethylenically unsaturated bond or the like into the main chain or the side chain of the polymer. The crosslinkable functional group may also be introduced by copolymerization.

Examples of the polymer having ethylenically unsaturated bond in the main chain of the molecule may include poly-1,4-butadiene, poly-1,4-isoprene and the like.

An example of the polymer having ethylenically unsaturated bond in the side chain of the molecule may be an ester or amide polymer of acrylic acid or methacrylic acid, which has ethylenically unsaturated bond in the ester or amide residue (R in —COOR or —CONHR).

As examples of the residue (said R) having ethylenically unsaturated bond, mention may be made of $-(CH_2)_nCR^1=CR^2R^3$, $-(CH_2O)_nCH_2CR^1=CR^2R^3$, $-(CH_2CH_2O)_nCH_2CR^1=CR^2R^3$, $-(CH_2)_nNH-CO-O-CH_2CR^1=CR^2R^3$, $-(CH_2)_n-O-CO-CR^1=CR^2R^3$ and $-(CH_2CH_2O)_2-X$, wherein $R^1$ to $R^3$ each represent a hydrogen atom, a halogen atom or an alkyl group, an aryl group, an alkoxy group or an aryloxy group respectively having 1 to 20 carbon atoms, and $R^1$ and $R^2$ or $R^3$ may be joined together to form a ring; n represents an integer between 1 and 10; and X represents a dicyclopentadienyl residue.

Specific examples of the ester residue may include $-CH_2CH=CH_2$ (described in JP-B No. 7-21633), $-CH_2CH_2O-CH_2CH=CH_2$, $-CH_2C(CH_3)=CH_2$, $-CH_2CH=CH-C_6H_5$, $-CH_2CH_2OCOCH=CH-C_6H_5$, $-CH_2CH_2-NHCOO-CH_2CH=CH_2$ and $-CH_2CH_2O-X$, wherein X represents a dicyclopentadienyl residue.

Specific examples of the amide residue may include $-CH_2CH=CH_2$, $-CH_2CH_2-Y$, wherein Y represents a cyclohexene residue, and $-CH_2CH_2-OCO-CH=CH_2$.

Concerning the crosslinkable binder polymer, a free radical (a polymerization-initiating radical, or a growing radical in the course of polymerization of the polymeric compound) is added to the crosslinkable functional group, addition polymerization is effected directly between the polymers or via the polymerization chains of the polymeric compounds, and thereby crosslinking is achieved between the polymeric molecules to finally cure. Or else, an atom in the polymer (for example, a hydrogen atom on a carbon atom adjacent to the functional crosslinking group) is removed by a free radical, subsequently polymeric radicals are generated and joined together, and thereby crosslinking is achieved between the polymeric molecules to finally cure.

The content of the crosslinkable group in the binder polymer (the content of the radical-polymerizable, unsaturated double bond as measured by iodine titration) is preferably 0.1 to 10.0 mmol, more preferably 1.0 to 7.0 mmol, and most preferably 2.0 to 5.5 mmol, with respect to 1 g of the binder polymer. Within these ranges, good sensitivity and good stability on storage are obtained.

Further, from the viewpoint of an improvement in the capability of the on-press development, the binder polymer preferably has high solubility or dispersibility in ink and/or fountain solution.

In order to improve the solubility or dispersibility in ink, the binder polymer is preferably oleophilic, whereas in order to improve the solubility or dispersibility in a fountain solution, the binder polymer is preferably hydrophilic. For this reason, in the invention, it is effective to use an oleophilic binder polymer and a hydrophilic binder polymer in combination.

As a hydrophilic binder polymer, mention may be favorably made of, for example, those having a hydrophilic group such as a hydroxyl group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amide group, a carboxymethyl group, a sulfonic group, a phosphoric group or the like.

Specific examples may include gum Arabic, casein, gelatin, starch derivatives, carboxymethyl cellulose and its sodium salt, cellulose acetate, sodium alginate, vinyl acetate-maleic acid copolymers, styrene-maleic acid copolymers, polyacrylic acids and their salts, polymethacrylic acids and their salts, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate homopolymers and copolymers of hydroxybutyl acrylate, polyethylene glycols, hydroxypropylene polymers, polyvinyl alcohols, hydrolyzed polyvinyl acetate having a degree of hydrolysis of 60 mol % or more, and preferably 80 mol % or more, polyvinyl formal, polyvinyl butyral, polyvinyl pyrrolidone, homopolymers and copolymers of acrylamide, homopolymers and copolymers of methacrylamide, homopolymers and copolymers of N-methylol acrylamide, polyvinyl pyrrolidone, alcohol-soluble nylon, polyether of 2,2-bis-(4-hydroxyphenyl)propane and of epichlorohydrin, or the like.

The binder polymer preferably has a weight-average molecular weight of 5,000 or more, and more preferably of 10,000 to 300,000, and has a number-average molecular weight of 1,000 or more, and more preferably of 2,000 to 250,000. The polydispersity (weight-average molecular weight/number-average molecular weight) is preferably 1.1 to 10.

The binder polymer may be preferably any one of a random polymer, a block polymer and a graft polymer, a random polymer being more preferred. Also, the binder polymer may be used either alone or in mixture of two or more species.

The binder polymer can be synthesized by any conventionally known method. As the solvent used for the synthesis, mention may be made of, for example, tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethyl formamide, N,N-dimethyl acetamide, toluene, ethyl acetate, methyl lactate, ethyl lactate, dimethyl sulfoxide and water. These are used either alone or in mixture of two or more species.

As the radical polymerization initiator used for the synthesis of the binder polymer, known compounds such as azo-based initiators, peroxide initiators or the like may be used.

In the case of using the binder polymer in the image recording layer, the binder polymer content is from 10 to 90 mass %, preferably from 20 to 80 mass %, more preferably from 30 to 70 mass %, based on the entire solid content of the image recording layer. Within this range, good strength of image area and good image-forming property are obtained.

The polymerizable compound and the binder polymer are preferably used in amounts of giving a mass ratio of 1/9 to 7/3.

<Surfactant>

In the present invention, a surfactant is preferably used in the image recording layer so as to accelerate the on-press development at the initiation of printing and enhance the coated surface state. The surfactant includes a nonionic surfactant, an anionic surfactant, a cationic surfactant, an amphoteric surfactant, a fluorine-containing surfactant and the like. One surfactant may be used alone or two or more surfactants may be used in combination.

The nonionic surfactants used in the invention are not particularly limited and any known ones can be used. For example, mention may be made of polyoxyethylene alkylethers, polyoxyethylene alkylphenylethers, polyoxyethylene polystyryl phenylethers, polyoxyethylene polyoxypropylene alkylethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethyleneated castor oils, polyoxyethylene glycerin fatty acid partial esters, fatty acid diethanol amides, N,N-bis-2-hydroxyalkylamines, polyoxyethylene alkylamine, triethanolamine fatty acid esters, trialkylamine oxide, polyethylene glycol, and copolymers of polyethylene glycol and polypropylene glycol.

The anionic surfactants used in the invention are not particularly limited, and any conventional ones can be used. For example, mention may be made of fatty acid salts, abietic acid salts, hydroxyalkanesulfonic acid salts, alkanesulfonic acid salts, dialkylsulfosuccinic ester salts, straight-chained alkylbenzene sulfonic acid salts, branched-chained alkylbenzene sulfonic acid salts, alkylnaphthalene sulfonic acid salts, alkylphenoxy polyoxyetylene propylsulfonic acid salts, polyoxyethylene alkylsulfophenyl ether salts, sodium N-methyl-N-oleyltaurate, disodium N-alkylsulfosuccinic monoamide, petroleum sulfonic acid salts, beef tallow sulfate, sulfuric ester salts of fatty acid alkyl esters, alkyl sulfuric ester salts, polyoxyethylene alkylether sulfuric esters, fatty acid monoglyceride sulfuric ester salts, polyoxyethylene alkylphenyl ether sulfuric ester salts, polyoxyethylene styrylphenyl ether sulfuric ester salts, alkyl phosphoric ester salts, polyoxyethylene alkylether phosphoric ester salts, polyoxyethylene alkylphenyl ether phosphoric ester salts, partial saponification products of styrene/maleic anhydride copolymers, partial saponification products of olefin/maleic anhydride copolymers, and naphthalene sulfonate formalin condensates.

The cationic surfactants used in the invention are not particularly limited, and any conventional ones can be used. For example, mention may be made of alkylamine salts, quaternary ammonium salts, polyoxyethylene alkylamine salts, and polyethylene polyamine derivatives.

The amphoteric surfactants used in the invention are not particularly limited, and any conventional ones can be used. For example, carboxybetaines, aminocarboxylic acids, sulfobetaines, amino sulfuric esters and imidazolines may be mentioned.

In addition, among the above-described surfactants, those referred to as "polyoxyethylene" may also be read as "polyoxyalkylene" such as polyoxymethylene, polyoxypropylene, polyoxybutylene or the like, and the invention can also make use of those surfactants.

For more preferred surfactants, fluorine-based surfactants containing a perfluoroalkyl group in the molecule may be mentioned. Such fluorine-based surfactants may include, for example, anionic type such as perfluoroalkyl carboxylate, perfluoroalkyl sulfonate, perfluoroalkyl phosphoric esters or the like; amphoteric type such as perfluoroalkyl betaine or the like; cationic type such as perfluoroalkyl trimethyl ammonium salts or the like; and nonionic type such as perfluoroalkylamine oxide, perfluoroalkyl ethylene oxide adducts, oligomers containing perfluoroalkyl group and hydrophilic group, oligomers containing perfluoroalkyl group and lipophilic group, oligomers containing perfluoroalkyl group, hydrophilic group and lipophilic group, urethane containing perfluoroalkyl group and lipophilic group, or the like. Further, the fluorine-based surfactants as described in JP-A Nos. 62-170950, 62-226143 and 60-168144 are also preferred.

The surfactants can be used either alone or in combination of two or more species.

The content of the surfactants is preferably 0.001 to 10% by mass, and more preferably 0.01 to 7% by mass, with respect to the total solids in the image recording layer.

<Colorant>

In the present invention, various compounds may be further added, if desired, in addition to the above-described components. For example, a dye having large absorption in the visible light region can be used as a colorant of the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industry Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes described in JP-A-62-293247. Also, pigments such as phthalocyanine-based pigment, azo-based pigment, carbon black and titanium oxide may be suitably used.

The colorant is preferably added, because the image area and the non-image area after image formation can be clearly distinguished. The amount of the colorant added is from 0.01 to 10 mass % based on the entire solid content of the image recording material.

<Polymerization Inhibitors>

A small amount of thermal polymerization-preventing agent is preferably added to the image recording layer of the invention, in order to prevent unnecessary thermal polymerization of the radical-polymerizable compound (C) during the preparation or storage of the image recording layer.

Examples of such thermal polymerization-preventing agent may be mentioned favorably of hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and the aluminum salt of N-nitroso-N-phenylhydroxylamine.

The amount of the thermal polymerization-preventing agent added is preferably about 0.01% to about 5% by mass with respect to the total solids in the image recording layer.

<Higher Fatty Acid Derivatives, Etc.>

In the image recording layer of the invention, higher fatty acid derivatives such as behenic acid, behenic acid amide or the like may be added and localized at the surface of the image recording layer during the course of drying after coating, in order to prevent the inhibition of polymerization by oxygen. The amount of higher fatty acid derivatives added is preferably about 0.1% to about 10% by mass with respect to the total solids in the image recording layer.

<Plasticizers>

The image recording layer of the invention may contain a plasticizer in order to improve the capability of the on-press development.

As such plasticizer, mention may be made preferably of, for example, phthalic esters such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthatlate, diaryl phthalate or the like; glycol esters such as dimethyl glycol phthalate, ethylphthalylethyl glycolate, methylphthalylethyl glycolate, butylphthalylbutyl glycolate, triethylene glycol dicaprilic ester or the like; phosphoric esters such as tricresyl phosphate, triphenyl phosphate or the like, aliphatic dibasic acid esters such as diisobutyl adipate, dioctyl adipate, dimethyl sebacate, dibutyl sebacate, dioctyl azelate, dibutyl maleate or the like; polyglycidyl methacrylate, triethyl citrate, glycerin triacetyl ester, butyl laurate, or the like.

The content of the plasticizer is preferably about 30% by mass or less, with respect to the total solids in the image recording layer.

<Inorganic Microparticles>

The image recording layer of the invention may contain inorganic microparticles for the improvement of the cured film strength at the image area and for the improvement of the capability of the on-press development at the non-image area.

As such inorganic microparticles, mention may be made very favorably of, for example, silica, alumina, magnesium oxide, titanium oxide, magnesium carbonate, calcium alginate or mixtures thereof. Even though they may not be photothermo convertible, the microparticles can be used for reinforcement of the coating, intensification of the interface-adherence by means of surface roughening, or the like.

Inorganic microparticles have an average particle size of preferably 5 μm to 10 μm, and more preferably 0.5 to 3 μm. In these ranges, they can be stably distributed within the image recording layer to sufficiently maintain the film strength of the image recording layer, and can form a non-image area which has excellent hydrophilicity, making it difficult to be contaminated upon printing.

Such inorganic microparticles as described in the above are easily available as commercial products such as a colloidal silica dispersion or the like.

The content of the inorganic microparticles is preferably 20% by mass or less, and more preferably 10% by mass or less, with respect to the total solids in the image recording layer.

<Low Molecular Hydrophilic Compounds>

The image recording layer of the invention may contain a hydrophilic low molecular compound in order to improve the capability of the on-press development. Examples of the hydrophilic low molecular compound may be mentioned of, as water-soluble organic compounds, glycols such as ethylene glycol, diethylene glycol, triethylene glycol, propylene glycol, dipropylene glycol, tripropylene glycol or the like and ether or ester derivatives thereof, polyhydroxys such as glycerin, pentaerythritol or the like; organic amines such as triethanolamine, diethanolamine, monoethanolamine or the like and salts thereof; organic sulfonates such as toluene sulfonate, benzene sulfonate or the like and salts thereof; organic phosphonates such as phenyl phosphonate or the like and salts thereof; organic carboxylic acids such as tartaric acid, oxalic acid, citric acid, malic acid, lactic acid, gluconic acid, amino acids or the like and salts thereof.

<Formation of Radical-Polymerization Type Image Recording Layer>

In the present invention, the image recording layer may be formed from (A) an infrared absorbent, (B) an iodonium salt, (C) a radical-polymerizable compound, a binder polymer, a surfactant and the like. Alternatively, if desired, (A) an infrared absorbent and (B) an iodonium salt may be incorporated into a layer different from the image recording layer. Examples of the different layer in which (A) an infrared absorbent and (B) an iodonium salt are incorporated include an undercoat layer and a protective layer. When (A) an infrared absorbent and (B) an iodonium salt are incorporated into an undercoat layer, a polymerization reaction at the interface with the substrate proceeds and the press life is enhanced. Also, when (A) an infrared absorbent and (B) an iodonium salt are incorporated into a protective layer, the suitability for plate inspection is enhanced.

As for the method of incorporating the above-described image recording layer constituent components into the image recording layer, several embodiments can be used in the present invention. One is an embodiment of dissolving the constituent components in an appropriate solvent and coating the obtained solution as described, for example, in JP-A-2002-287334, and another is an embodiment of enclosing the image recording layer constituent components in a microcapsule and incorporating the microcapsule into the image recording layer (microcapsule-type image recording layer) as described, for example, in JP-A-2001-277740 and JP-A-2001-277742. In the microcapsule-type image recording layer, the constituent components may be incorporated also outside the microcapsule. In a preferred embodiment of the microcapsule-type image recording layer, hydrophobic constituent components are enclosed in a microcapsule and hydrophilic constituent components are incorporated outside the microcapsule.

It is a preferred embodiment for obtaining a good printout image and good press life that out of the constituent components of the image recording layer, an infrared absorbent, a radical-polymerization initiator and a compound of changing in the color under the action of a radical are microencapsulated, because the printout image-forming reaction system and the printing image-forming reaction system are separated, and inhibition of each other's reactions can be avoided.

For microencapsulating those constituent components of the image recording layer, a conventionally known method can be applied. Examples of the method for producing a microcapsule include, but are not limited to, a method utilizing coacervation described in U.S. Pat. Nos. 2,800,457 and 2,800,458, a method by interfacial polymerization described in U.S. Pat. No. 3,287,154, JP-B-38-19574 and JP-B-42-446, a method by polymer precipitation described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde or urea-formaldehyde-resorcinol wall material described in U.S. Pat. Nos. 4,001,140, 4,087,376 and 4,089,802, a method using a wall material such as melamine-formaldehyde resin or hydroxy cellulose described in U.S. Pat. No. 4,025,445, an in situ method by monomer polymerization described in JP-B-36-9163 and JP-A-51-9079, a spray drying method described in British Patent 930,422 and U.S. Pat. No. 3,111,407, and an electrolytic dispersion cooling method described in British Patents 952,807 and 967,074.

The microcapsule wall for use in the present invention preferably has a three-dimensionally crosslinked structure and has a property of swelling with a solvent. From this standpoint, the wall material of the microcapsule is preferably polyurea, polyurethane, polyester, polycarbonate, polyamide or a mixture thereof, more preferably polyurea or polyurethane. Also, the above-described compound having a crosslinking functional group such as ethylenically unsaturated bond, which can be introduced into the binder polymer, may be introduced into the microcapsule wall.

The average particle diameter of the microcapsule is preferably from 0.01 to 3.0 μm, more preferably from 0.05 to 2.0 μm, still more preferably from 0.10 to 1.0 μm. Within this range, good resolution and good aging stability are obtained.

The image recording layer of the present invention is formed by dispersing or dissolving the above-described necessary components in a solvent to prepare a coating solution and coating the obtained coating solution. Examples of the solvent used here include, but are not limited to, ethylene dichloride, cyclohexanone, methyl ethyl ketone, methanol, ethanol, propanol, ethylene glycol monomethyl ether, 1-methoxy-2-propanol, 2-methoxyethylacetate, 1-methoxy-2-propylacetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water. One of these solvents is used alone or a mixture thereof is used. The solid content concentration of the coating solution is preferably from 1 to 50 mass %.

The image recording layer of the present invention may also be formed by dispersing or dissolving the same or different components described above in the same or different solvents to prepare a plurality of coating solutions and repeating the coating and drying multiple times.

The coated amount (solid content) of the image recording layer obtained on the support after the coating and drying varies depending on the use but in general, is preferably from 0.3 to 3.0 $g/m^2$. Within this range, good sensitivity and good film properties of the image recording layer are obtained.

As for the coating method, various methods may be used and examples thereof include bar coater coating, rotary coating, spray coating, curtain coating, dip coating, air knife coating, blade coating and roll coating.

The support for use in the lithographic printing plate precursor of the present invention is not particularly limited and may be sufficient if it is a dimensionally stable plate-like material. Examples thereof include paper, paper laminated with plastic (e.g., polyethylene, polypropylene, polystyrene), metal plate (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and paper or plastic film laminated or vapor-deposited with the above-described metal. Among these supports, polyester film and aluminum plate are preferred, and aluminum plate is more preferred because this is dimensionally stable and relatively inexpensive.

The aluminum plate is a pure aluminum plate, a metal plate containing aluminum as the main component and trace amounts of other elements, or an aluminum alloy thin film having a plastic laminated thereon. Other elements contained in the aluminum alloy may include silicon, iron, manganese, copper, magnesium, chromium, zinc, bismuth, nickel, titanium or the like. The content of other elements in the alloy is preferably 10% by mass or less. Although a pure aluminum plate is preferred in the invention, since it is difficult to produce perfectly pure aluminum by the current refinery technology, one containing trace amounts of other elements will be appropriate. The aluminum plate is not characterized by the composition, and thus a plate of any known material for general use can be appropriately used.

The thickness of the support is preferably 0.1 to 0.6 mm, more preferably 0.15 to 0.4 mm, and even more preferably 0.2 to 0.3 mm.

Prior to the use, the aluminum plate is preferably subjected to surface treatment such as surface roughening, formation of hydrophilic film or the like. Such surface treatment facilitates the improvement of hydrophilicity and assurance of close adherence between the image recording layer and the support. Before surface-roughening the aluminum plate, if desired, degreasing by surfactants, organic solvents, alkaline aqueous solutions or the like is carried out to remove the oil for rolling on the surface.

<Surface-Roughening Treatment>

The surface-roughening treatment of the aluminum plate surface may be achieved by various methods, and for example, mechanical surface-roughening treatment, electrochemical surface-roughening treatment (surface-roughening by dissolve the surface electrochemically), chemical surface-roughening treatment (surface-roughening by selectively dissolving the surface chemically) or the like may be mentioned.

As the mechanical surface-roughening method, any known techniques such as ball polishing, brush polishing, blast polishing, buff polishing or the like can be used.

As the electrochemical surface-roughening method, for example, a method of surface-roughening by means of alternative current or direct current in an electrolytic solution containing an acid such as hydrochloric acid, nitric acid or the like may be mentioned. Further, the method of using a mixed acid as described in JP-A No. 54-63902 can be also mentioned.

<Formation of Hydrophilic Film>

The aluminum plate thus subjected to the surface-roughening treatment and other treatments as necessary is again subjected to a treatment to build thereon a hydrophilic film of low heat conductivity. The hydrophilic film has a heat conductivity in the direction of film depth of 0.05 W/mK or more, preferably 0.08 W/mK or more, and 0.5 W/mK or less, preferably 0.3 W/mK or less, even more preferably 0.2 W/mK or less. When the heat conductivity in the depth direction is 0.05 W/mK to 0.5 W/mK, diffusion of the heat generated in the image recording layer upon exposure to laser light to the support can be suppressed. As a result, when the lithographic printing plate precursor of the invention is used as the on-press development type or the non-treatment type, the heat generated upon exposure to laser light can be utilized effectively, and thus the sensitivity is enhanced, and sufficient formation of images to be printed and images to be burned can be achieved.

Hereinafter, an explanation will be given on the heat conductivity in the film depth direction of the hydrophilic film as specified in the invention. For the method of measuring the heat conductivity of thin film, various methods have been reported hitherto. In 1986, Ono et al. reported the measurement of the heat conductivity in the plane direction of thin film using a thermograph. Further, there are reports on the attempt to apply the method of heating by alternating current onto the measurement of the thermal properties of thin film. History of the method of heating by alternating current may be traced up to a report in 1863, but a variety of measuring methods have been suggested owing to the recent development of the methods of heating by laser in combination with the Fourier transformation. An apparatus making use of the laser Angstrom technique is in fact commercially available. These methods all determine the heat conductivity in the plane direction (inner surface direction) of a thin film.

However, on consideration of the heat conductivity of thin film, rather the heat diffusion in the depth direction is a more important factor.

As often reported, the heat conductivity of thin film is not said to be isotropic, and especially for the invention, direct measurement of the heat conductivity in the thickness direction is very important. From this point of view, as an attempt to measure the thermal properties in the direction of film thickness in the thin film, a method of using the thermocomparator as described in Lambropoulos, J. Appl. Phys., 66(9) (Nov. 1, 1989) and Henager et al., APPLIED OPTICS, Vol. 32, No. 1 (Jan. 1, 1993) have been reported. Moreover, a method of measuring the heat diffusivity in the polymer thin film by temperature wave thermal analysis with application of Fourier analysis has been recently reported by Hashimoto et al. (Netsu Sokutei, 27(3) (2000)).

The heat conductivity in the film depth direction of the hydrophilic film as specified in the invention is measured by the above-mentioned method of using a thermocomparator. This method will be explained specifically below. The fundamental principle of this method is described in detail in the articles of Lambropoulos et al. and of Henager et al. as described earlier. In the invention, measurement was performed using the thermocomparator shown in FIG. 3 in JP-A No. 2003-103951, according to the method described in the same publication.

The relationship between the respective temperatures and the heat conductivity of the film is as shown in Equation (1) below:

$$\frac{(T_r - T_b)}{(T_r - T_t)} = \left(\frac{4K_1 r_1}{K_{tf} A_3}\right)t + \left(1 + \left(\frac{4K_1 r_1}{K_2 A_2}\right)t_2 + \left(\frac{K_1 r_1}{K_4 r_1}\right)\right) \quad (1)$$

wherein the symbols in the above Equation (1) are as follows:

$T_t$: tip end temperature, $T_b$: heat sink temperature, $T_r$: reserver temperature, $K_{tf}$: heat conductivity of the film, $K_1$: heat conductivity of the reserver, $K_2$: heat conductivity of the tip (in the case of oxygen-free copper, 400 W/mK), $K_4$: heat conductivity of a metal substrate (in the case of not having a film), $r_1$: the radius of curvature at the tip end, $A_2$: contact area between the reserver and the tip, $A_3$: contact area between the tip and the film, t: film thickness, $t_2$: contact thickness (≈0).

By measuring each temperature ($T_t$, $T_b$ and $T_r$) while varying the film thickness (t) and plotting, the gradient of Equation (1) and subsequently the heat conductivity of the film ($K_{tf}$) can be obtained. That is, this gradient is σ value determined by the heat conductivity of the reserver ($K_1$), the radius of curvature at the tip end ($r_1$), the heat conductivity of the film ($K_{tf}$) and the contact area between the tip and the film ($A_3$), as obvious from Equation (1), and $K_1$, $r_1$ and $A_3$ are already known values. Thus, from this gradient, the value of $K_{tf}$ can be obtained.

The inventors obtained the heat conductivity of the hydrophilic film (the anodic oxidation film, $Al_2O_3$) constructed on an aluminum substrate using the above-described method of measurement. While varying the film thickness, the temperatures were measured, and the resulting heat conductivity of $Al_2O_3$ obtained from the gradient of the graph was 0.69 W/mK. This shows good correlation with the results of the study by Lambropoulos et al. as described above. Further, this result also shows that the thermal property value of thin film is different from the bulk thermal property value (the bulk heat conductivity of $Al_2O_3$ is 28 W/mK).

In the hydrophilic film of the lithographic printing plate precursor of the invention, it is advantageous to use the above-mentioned method for the measurement of the heat conductivity along the film thickness, since it is possible to obtain uniform results even with respect to the roughened surfaces of the lithographic printing plate, by taking the tip end as a minute one and by maintaining the pressure load constant. The values of the heat conductivity are preferably determined as the average of a plurality of different points, for example, five points, measured on the sample.

The film thickness of the hydrophilic film is preferably 0.1 μm or more, more preferably 0.3 μm or more, and particularly preferably 0.6 μm or more, in the aspects of the anti-damaging property and the resistance to printing. Furthermore, in the aspect of the production costs, it is preferable, upon consideration of the requirement of enormous energy to construct a thick film, that the film thickness be 5 μm or less, more preferably no more than 3 μm, and particularly preferably 2 μm r less.

The hydrophilic film of the invention preferably has a density of 1000 to 3200 kg/$m^3$, in the aspects of the effect on the thermal insulation, film strength, and anti-contamination during printing.

For the method of measuring density, it can be calculated, for example, from the mass measurement according to the Mason's method (the method of weighing the anodic oxidation film by dissolution in a mixed solution of chromic acid/phosphoric acid), and from the film thickness measured by SEM observation of the cross-section, using the following equation:

Density (kg/$m^3$)=(mass of the hydrophilic film per unit area/film thickness)

As the method of constructing the hydrophilic film, anodic oxidation, vapor deposition, a CVD process, sol-gel process, spectering, ion-plating, diffusion technique or the like may be appropriately used, without being particularly limited. Further, a method of coating a solution contained hollow particles mixed in a hydrophilic resin or a sol-gel solution may be also used.

Among these, it is preferable to use the treatment of producing an oxide by anodic oxidation, that is, to use the anodic oxidation treatment. The anodic oxidation treatment can be carried out by any method conventionally used in the art.

Specifically, in an aqueous solution or a non-aqueous solution containing sulfuric acid, phosphoric acid, chromic acid, oxalic acid, sulfamic acid, benzenesulfonic acid or the like, alone or in combination of two or more species, direct current or alternating current can be passed through an aluminum plate to form an anodic oxidation film, as a hydrophilic film, on the surface of the aluminum plate. Since the conditions for the anodic oxidation treatment often vary with the electrolytic solution used, they cannot be fixed, but the following conditions will be suitable: in general, concentration of electrolytic solution 1 to 80% by mass, liquid temperature 5 to 70° C., current density 0.5 to 60 A/$dm^2$, voltage 1 to 200 V, and time for electrolysis 1 to 1000 seconds. Among these anodic oxidation treatment methods, preferred are the method of anodizing with high current density in a sulfuric acid electrolytic solution as described in GB No. 1,412,768, and the method of anodizing by using phosphoric acid for the electrolytic bath as described in U.S. Pat. No. 3,511,661. Further, it is also possible to carry out multiple anodic oxidation processes by anodizing in sulfuric acid and again anodizing in phosphoric acid.

The anodic oxidation film according to the invention is preferably 0.1 g/$m^2$ or more, more preferably 0.3 g/$m^2$ or more, particularly preferably 2 g/$m^2$ or more, and even more preferably 3.2 g/$m^2$ or more in view of uneasy damage and press life. Further, upon consideration of the requirement of enormous energy to construct a thick film, it is preferably 100 g/$m^2$ or less, more preferably 40 g/$m^2$ or less, and particularly preferably 20 g/$m^2$ or less.

The anodic oxidation film has fine recesses, also called as micropores, formed on the surface of the film as evenly distributed. The density of the micropores existing in the anodic oxidation film can be controlled by selecting the treatment conditions appropriately. By increasing the micropore density, the heat conductivity along the film depth direction of the anodic oxidation film can be adjusted to 0.05 to 0.5 W/mK. Further, the size of the micropores can be adjusted by selecting the treatment conditions appropriately. By increasing the size of the micropores, the heat conductivity along the film depth of the anodic oxidation film can be adjusted to 0.05 to 0.5 W/mK. In addition, the size of the micropores can be adjusted by selecting the treatment conditions appropriately. By increasing the size of the micropores, the heat conductivity along the film depth direction of the anodic oxidation film can be adjusted to 0.05 to 0.5 W/mK.

Under the purpose of reducing the heat conductivity in the invention, it is preferable to perform the pore-widening treatment of increasing the pore size of the micropores after the anodic oxidation treatment. This pore-widening treatment is to dissolve the anodic oxidation film and to increase the pore size of the micropores by immersing the aluminum substrate with the anodic oxidation film formed thereon in an aqueous acid solution or in an aqueous alkali solution. The pore-widening treatment is achieved such that the amount of dissolution of the anodic oxidation film is preferably 0.01 to 20 g/$m^2$, more preferably 0.1 to 5 g/$m^2$, and particularly preferably 0.2 to 4 g/$m^2$.

When an aqueous acid solution is used in the pore-widening treatment, it is preferable to use an aqueous solution of an inorganic acid such as sulfuric acid, phosphoric acid, nitric acid, hydrochloric acid or the like as well as mixtures thereof. The concentration of the aqueous acid solution is preferably 10 to 1000 g/L, and more preferably 20 to 500 g/L. The temperature of the aqueous acid solution is preferably 10 to 90° C., and more preferably 30 to 70° C. The time for immersion into the aqueous acid solution is preferably 1 to 300 seconds, and more preferably 2 to 100 seconds. On the other hand, when an aqueous alkali solution is used in the pore-widening treatment, it is preferably to use an aqueous solution of at least one alkali selected from the group formed by sodium hydroxide, potassium hydroxide and lithium hydroxide. The pH of the aqueous alkali solution is preferably 10 to 13, and more preferably 11.5 to 13.0. The temperature of the aqueous alkali solution is preferably 10 to 90° C., and more preferably 30 to 50° C. The time for immersion into the aqueous alkali solution is preferably 1 to 500 seconds, and more preferably 2 to 100 seconds. However, since excessive enlargement of the size of the micropores at the outermost surface leads to deterioration of the contamination performance during printing, the size of the micropores at the outermost surface is preferably 40 nm or less, more preferably 20 nm or less, and most preferably 10 nm or less. Then, the heat-insulating property and the contamination performance can be satisfied together. In a more preferably form of the anodic oxidation film, the size of the micropores at the surface is 0 to 40 nm, and the size of the internal micropores is 20 to 300 nm. For example, it is known that when the same type of the electrolytic solution is used, the pore diameter of the pores produced by electrolysis is directly proportional to the electrolytic voltage during electrolysis. By using this property to gradually elevate the electrolytic voltage, a method of producing wider pores as approaching the bottom. In addition, it is also known that when the type of the electrolytic solution is changed, the pore diameter changes along, and the pore diameter increases with the order of sulfuric acid, oxalic acid and phosphoric acid. Therefore, a method of anodizing using sulfuric acid in the electrolytic solution at a first step and then using phosphoric acid at a second step may be used. Further, pore-sealing treatment as mentioned later, may be carried out on the support for the lithographic printing plate obtained by subjecting it to the anodic oxidation treatment and/or pore-widening treatment.

Further, the hydrophilic film may be also an inorganic film constructed by the techniques of spectering, a CVD process or the like, in addition to the anodic oxidation film as described earlier. As the compound constituting such inorganic film, for example, oxides, nitrides, silicides, borides and carbides may be mentioned. Further, the inorganic film may be composed of a single compound or a mixture of compounds. As the compound constituting the inorganic film, mention may be made specifically of aluminum oxide, silicon oxide, titanium oxide, zirconium oxide, hafnium oxide, vanadium oxide, niobium oxide, tantalum oxide, molybdenum oxide, tungsten oxide, chromium oxide; aluminum nitride, silicon nitride, titanium nitride, zirconium nitride, hafnium nitride, vanadium nitride, niobium nitride, tantalum nitride, molybdenum nitride, tungsten nitride, chromium nitride, silicon nitride, boron nitride; titanium silicide, zirconium silicide, hafnium silicide, vanadium silicide, niobium silicide, tantalum silicide, molybdenum silicide, tungsten silicide, chromium silicide; titanium boride, zirconium boride, hafnium boride, vanadium boride, niobium boride, tantalum boride, molybdenum boride, tungsten boride, chromium boride; aluminum carbide, silicon carbide, titanium carbide, zirconium carbide, hafnium carbide, vanadium carbide, niobium carbide, tantalum carbide, molybdenum carbide, tungsten carbide, chromium carbide or the like.

<Pore-Sealing Treatment>

According to the invention, the support for the lithographic printing plate of the invention obtained by forming a hydrophilic film thereon, as described above, may be subjected to the pore-sealing treatment. The pore-sealing treatment used in the invention may be exemplified by the pore-sealing treatment to the anodic oxidation film by pressurized steam or hot water as described in JP-A Nos. 4-176690 and 11-301135. Also, use may be made of known methods such as silicate treatment, aqueous dichromate solution treatment, nitrite treatment, ammonium acetate treatment, electrodeposition sealing treatment, triethanolamine treatment, barium carbide treatment, treatment with hot water containing trace amount of phosphate, or the like. Regarding the pore-sealing treated film, different pore-sealed film may be formed depending on the method of pore-sealing treatment such that, for example, in the case of electrodeposition sealing treatment, the sealed film is formed from the bottom part of the pores, whereas in the case of steam sealing treatment, the sealed film is formed from the upper part of the pores. In addition to these, there may be mentioned of treatment of immersion in a solution, spray treatment, coating treatment, vapor deposition treatment, spectering, ion-plating, thermal spraying, electroplating and the like, without being limited to these. Particularly preferred among these is the pore-sealing treatment of using particles with an average particle size of 8 to 800 nm, as described in JP-A No. 2002-214764.

The pore-sealing treatment using particles is carried out using particles with an average particle size of 8 to 800 nm, preferably with an average particle size of 10 to 500 nm, and more preferably with an average particle size of 10 to 150 nm. Within these ranges, the risk that particles would go inside of the micropores present in the hydrophilic film is reduced, the effect of high sensitization level can be sufficiently obtained, and sufficient close adherence is achieved between the hydrophilic film and the image recording layer, thus resulting in excellent resistance to printing. The thickness of the particle layer is preferably 8 to 800 nm, and more preferably 10 to 500 nm.

The particles used in the invention have a heat conductivity of preferably 60 W/mK or less, more preferably 40 W/mK or less, and particularly preferably 0.3 to 10 W/mK or less. When the heat conductivity is 60 W/mK or less, sufficient inhibition of heat diffusion at the aluminum substrate is achieved, and thus the effect of high sensitization level can be sufficiently obtained.

As the method of constructing the particle layer, for example, mention may be made of the treatment of immersion in a solution, spray treatment, coating treatment, electrolysis treatment, vapor deposition treatment, spectering, ion-plating, thermal spraying, electroplating and the like, without particularly limited to these.

The electrolysis treatment may be done by using direct current or alternating current. The waveform of the alternating current used in this electrolysis treatment may be the sine wave, the rectangular wave, the triangular wave, the trapezoidal wave or the like. Further, the frequency of the alternating current is preferably 30 to 200 Hz, and more preferably 40 to 120 Hz, from the viewpoint of the production costs for the power supply apparatus. When the trapezoidal wave is used for the waveform of alternating current, the time taken by the current to reach from 0 to the peak value, tp, is preferably 0.1 to 2 msec, and more preferably 0.3 to 1.5 msec. When tp is less than 0.1 msec, the impedance of the power supply circuit would have an effect such as to require a large current voltage at the initiation of the current waveform and to increase the installing costs for the power supply.

As the hydrophilic particles, it is preferable to use $Al_2O_3$, $TiO_2$, $SiO_2$ and $ZrO_2$, either alone or in combination of two or more species. The electrolytic solution can be obtained, for example, by suspending the hydrophilic particles in water or the like such that the content thereof is 0.01 to 20% by mass with respect to the solution. Since the electrolytic solution works by making the electric charges to be either positive or negative, the pH of the solution can be adjusted, for example, by adding sulfuric acid or the like. The electrolytic treatment is performed, for example, by using direct current and the above-mentioned electrolytic solution, and using an aluminum plate as the cathode, under the conditions of a voltage of 10 to 200 V and a time of 1 to 600 seconds. According to this method, the openings of the micropores present in the anodic oxidation film can be easily sealed, with the inside thereof remained empty.

In addition, for a further method of pore-sealing treatment, mention may be made of a method of constructing, by coating, a layer consisting of a compound having at least one amino group and at least one selected from the group of a carboxyl group and a salt thereof, and a sulfo group and a salt thereof as described in JP-A No. 60-149491; a layer consisting of a compound selected from compounds having at least one amino group and at least one hydroxyl group and salts thereof as described in JP-A No. 60-232998; a layer containing a phosphoric acid salt as described in JP-A No. 62-19494; a layer consisting of a polymeric compound having as the repeating unit, at least one monomer unit having sulfo group in the molecule as described in JP-A No. 59-101651; or the like.

Further, mention may be also made of a method of constructing a layer of a compound selected from carboxymethylcellulose; dextrin; gum Arabic; phosphonic acids having an amino group such as 2-aminoethyl phosphonic acid or the like; organic phosphonic acids such as optionally substituted phenyl phosphonic acid, naphthyl phosphonic acid, alkyl phosphonic acid, glycerophosphonic acid, methylene diphosphonic acid, ethylene diphosphonic acid or the like; organic phosphoric esters such as optionally substituted phenyl phosphoric acid, naphthyl phosphoric acid, alkyl phosphoric acid, glycerophosphoric acid or the like; organic phosphinic acids such as optionally substituted phenyl phosphinic acid, naphthyl phosphinic acid, alkyl phosphinic acid, glycerophosphinic acid or the like; amino acids such as glycine, β-alanine or the like; amine hydrochlorides having a hydroxyl group such as triethanolamine hydrochloride or the like; and the like.

For the pore-sealing treatment, a treatment of constructing a film of a silane coupling agent having unsaturations may be carried out. As the silane coupling agent, mention may be made of, for example, N-3-(acryloxy-2-hydroxypropyl)-3-aminopropyltriethoxysilane, (3-acryloxypropyl)dimethylmethoxysilane, (3-acryloxypropyl)methyldimethoxysilane, (3-acryloxypropyl)trimethoxysilane, 3-(N-arylamino)propyltrimethoxysilane, aryldimethoxysilane, aryltriethoxysilane, aryltrimethoxysilane, 3-butenyltriethoxysilane, 2-(chloromethyl)aryltrimethoxysilane, methacrylamidopropyltriethoxysilane, N-(3-methacryloxy-2-hydroxypropyl)-3-aminopropyltriethoxysilane, (methacryloxymethyl) dimethylethoxysilane, methacryloxymethyltriethoxysilane, methacryloxymethyltrimethoxysilane, methacryloxypropyldimethylethoxysilane, methacryloxypropyldimethylmethoxysilane, methacryloxypropylmethyldiethoxysilane, methacryloxypropylmethyldimethoxysilane, methacryloxypropylmethyltriethoxysilane, methacryloxypropylmethyltrimethoxysilane, methacryloxypropyl tris(methoxyethoxy) silane, methoxydimethylvinylsilane, 1-methoxy-3-(trimethylsiloxy)butadiene, styrylethyltrimethoxysilane, 3-(N-styrylmethyl-2-aminoethylamino)-propyltrimethoxysilane hydrochloride, vinyldimethylethoxysilane, vinyldiphenylethoxysilane, vinylmethyldiethoxysilane, vinylmethyldimethoxysilane, O-(vinyloxyethyl)-N-(triethoxysilylpropyl)urethane, vinyltriethoxysilane, vinyltrimethoxysilane, vinyltri-t-butoxysilane, vinyltriisopropoxysilane, vinyltriphenoxysilane, vinyltris(2-methoxyethoxy)silane, and diarylaminopropylmethoxysilane. Among these, preferred are the silane coupling agents having a methacryloyl group and an acryloyl group whose unsaturation groups are fast-reactive.

In addition, mention may be made of the sol-gel coating treatment as described in JP-A No. 5-50779; the phosphonic acid coating treatment as described in JP-A No. 5-246171; the method of treatment by coating a material for backcoating as described in JP-A Nos. 6-234284, 6-191173 and 6-230563; the phosphonic acid treatment as described in JP-A No. 6-262872; the coating treatment as described in JP-A No. 6-297875; the anodic oxidation treatment method as described in JP-A No. 10-109480; the immersion treatment method as described in JP-A Nos. 2000-81704 and 2000-89466; or the like, and any of these methods may used.

After the formation of a hydrophilic film, if desired, hydrophilization treatment is carried out on the surface of the aluminum plate. Such hydrophilization treatment may be exemplified by the methods using alkali metal silicates as described in the specifications of U.S. Pat. Nos. 2,714,066, 3,181,461, 3,280,734 and 3,902,734. In these methods, the support is subjected to the immersion treatment or electrolysis treatment using an aqueous solution of sodium silicate or the like. In addition to these, there may be mentioned of the method of treating with potassium fluorozirconic acid as described in JP-B No. 36-22063, the method of treating with polyvinyl phosphonic acid described in U.S. Pat. Nos. 3,276,868, 4,153,461 and 4,689,272, or the like.

For the support, the average roughness at the central line is preferably 0.10 to 1.2 μm. In this range, good adherence to the image recording layer, good resistance to printing and good anti-contamination property can be obtained.

Further, the color density of the support is preferably 0.15 to 0.65 as the value of the reflective density. In this range, good image formation property due to prevention of halation during light exposure of the image and good plate inspection property after development can be obtained.

[Backcoat Layer]

After implementation of the surface treatment or formation of an undercoat layer on the support, a backcoat can be constructed on the opposite side of the support, if desired.

As such backcoat, for example, the coating layer consisting of a metal oxide which is obtained by hydrolysis and polycondensation of an organic polymeric compound as described in JP-A No. 5-45885, or an organic metal compound or an inorganic metal compound as described in JP-A No. 6-35174 can be favorably mentioned. Inter alia, it is preferable to use an alkoxy compound of silicon such as $Si(OCH_3)_4$, $Si(OC_2H_5)_4$, $Si(OC_3H_7)_4$, $Si(OC_4H_9)_4$ or the like from the viewpoint of the availability of the raw materials at low costs.

[Undercoat Layer]

In the lithographic printing plate precursor of the invention, an undercoat layer can be constructed between the image recording layer and the support, if desired. It is advantageous in achieving a high sensitization level because, as the undercoat layer functions as a heat-insulation layer, the heat generated by exposure to an infrared laser light can be utilized with good efficiency without being diffused into the support. Also, in the unexposed area, since the undercoat facilitates delamination of the image recording layer from the support, the property of the on-press development is improved.

As the undercoat layer, specifically, the silane coupling agent having an ethylenically double-bonded reactive group which is capable of undergoing addition polymerization as described in JP-A No. 10-282679, the phosphorus compound having an ethylenically double-bonded reactive group as described in JP-A No. 2-304441, or the like can be mentioned favorably.

The coating amount (solids) of the undercoat layer is preferably 0.1 to 100 mg/$m^2$, and more preferably 1 to 30 mg/$m^2$.

[Protective Layer]

In the lithographic printing plate precursor of the invention, a protective layer can be constructed on the image recording layer, if desired, under the purpose of prevention of the occurrence of damage, etc. in the image recording layer, blocking of oxygen, and prevention of aberration upon exposure to a high illumination intensity laser.

According to the invention, exposure to light is typically carried out under the atmosphere, and the protective layer prevents incorporation into the image recording layer, of any low molecular compound present in the atmosphere, which inhibits the image-forming reaction occurring in the image recording layer upon light exposure, such as oxygen, basic substances or the like, and thus prevents inhibition of the image-forming reaction occurring in the atmosphere upon light exposure. Therefore, the properties required from the protective layer are preferably low permeability to a low molecular compound such as oxygen, good permeability to the light used in exposure, excellent adherence to the image recording layer, and good removability during the process of the on-press development treatment after light exposure. Investigation on such protective layers having the above-mentioned properties is carried out more often than ever, and such protective layers are described in detail, for example, in U.S. Pat. No. 3,458,311 and JP-A No. 55-49729.

As the material used for the protective layer, examples may include water-soluble polymeric compounds having relatively high crystallinity. Specifically, mention may be made of water-soluble polymers such as polyvinyl alcohol, polyvinyl pyrrolidone, acidic celluloses, gelatin, gum Arabic, polyacrylic acid and the like.

When polyvinyl alcohol (PVA) among them is used as the main component, the best results can be obtained with respect to the fundamental properties such as oxygen blocking, removability of the developed image or the like. Polyvinyl alcohol may be partially substituted by esters, ethers or acetals, or may partially contain other copolymerizable components, as long as the polymer contains the unsubstituted vinyl alcohol unit which provides the ability of blocking oxygen and water-solubility required in the protective layer.

Specific examples of polyvinyl alcohol may be preferably those with the degree of polymerization being in a range of 300 to 2400 and the degree of hydrolysis in a range of 71 to 100 mol %. Mention may be made specifically of, for example, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8.

The component of the protective layer (selection of PVA, use of additives, etc.), the coating amount or the like may be appropriately selected in consideration of the properties such as clouding, close adherence, resistance to damage or the like, in addition to the ability of blocking oxygen and removability of the developed image. In general, as the degree of hydrolysis of PVA increases (that is, as the content of the unsubstituted vinyl alcohol unit in the protective layer is higher), or as the film thickness increases, the ability of blocking oxygen also increases, and this is preferable in the aspect of sensitivity. Also, it is preferable not to have excessively high oxygen permeability, in order to prevent unnecessary polymerization reactions during production and storage, unnecessary clouding during exposure of the image, and thickening of the image lines. Thus, the oxygen permeability A is preferably such that $0.2 \leqq A \leqq 20$ (cc/$m^2$ day) at 25° C. and 1 atmosphere.

As other constituents of the protective layer, glycerin, dipropylene glycol may be added in an amount equivalent to several percent by mass with respect to the water-soluble polymeric compound, in order to impart flexibility, and anionic surfactants such as sodium alkyl sulfate, sodium alkyl sulfonate or the like; cationic surfactants such as alkylaminocarboxylic acid salts, alkylaminodicarboxylic acid salts or the like; and nonionic surfactants such as polyoxyethylene alkylphenyl ether or the like may be also added in an amount of several percent by mass with respect to the (co)polymer.

The film thickness of the protective layer is suitably 0.1 to 5 μm, and particularly preferably 0.2 to 2 μm.

In addition, the close adherence to the image area, resistance to damage and the like are also very important in terms of the handlability of the lithographic printing plate precursor. That is, for the protective layer contains a water-soluble polymeric compound, when the hydrophilic protective layer is laminated on the image recording layer, the latter being oleophilic, delamination of the protective layer due to insufficient adhesive force is susceptible to occur, and there is a risk of suffering from defects such as poor film curing and the like, which in turn causes suppression of polymerization by oxygen at the delaminated area.

In this regard, there have been a variety of suggestions to improve adherence between the image recording layer and the protective layer. For example, it is described in JP-A No. 49-70702 and GB-A No. 1303578 that sufficient adherence can be achieved by mixing in a hydrophilic polymer mainly consisting of polyvinyl alcohol, an acrylic emulsion, a water-insoluble vinyl pyrrolidone-vinyl acetate copolymer or the like in a portion of 20 to 60% by mass and laminating the mixture on the image recording layer. According to the invention, all of these known techniques can be used. For the coating method of the protective layer, for example, U.S. Pat. No. 3,458,311 and JP-A No. 55-49729 describe the methods in detail.

In the present invention, the above-described printout image-forming components (a compound capable of causing change in the color under the action of radical, a radical polymerization initiator and an infrared absorbent) may be incorporated into the protective layer. This embodiment of incorporating these printout image-forming components not into the image recording layer but into the protective layer is preferred because the printout image-forming reaction can be separated from the polymerization reaction system in the image recording layer and these reactions can be prevented from inhibiting each other. Also, an embodiment of incorporating these printout image-forming components in the microencapsulated form into the protective layer is preferred. In the case of strengthening the printout image, the printout image-forming components may be incorporated into both the protective layer and the image-forming layer.

Furthermore, other functions may be imparted to the protective layer. For example, when a coloring agent (for example, a water-soluble dye) excellent in the transparency to infrared ray used for exposure and capable of efficiently absorbing light at other wavelengths is added, the suitability for safelight can be enhanced without causing reduction in the sensitivity.

[Exposure]

In the lithographic printing method of the present invention, the above-described lithographic printing plate precursor of the present invention is imagewise exposed by an infrared laser.

The infrared laser for use in the present invention is not particularly limited, but suitable examples thereof include a solid or semiconductor laser of emitting an infrared ray at a wavelength of 760 to 1,200 nm. The output of the infrared laser is preferably 100 mW or more and in order to shorten the exposure time, a multi-beam laser device is preferably used.

The exposure time is preferably 20μ seconds or less per one picture element. The irradiation amount of energy is preferably from 10 to 300 mJ/$cm^2$.

[Printing Method]

In the lithographic printing method of the present invention, after the lithographic printing plate precursor of the present invention is imagewise exposed with an infrared laser as described above, printing is performed by supplying an oily ink and an aqueous component without passing through any development processing step.

Specific examples of the method therefor include a method of exposing the lithographic printing plate precursor with an infrared laser, then loading it on a printing press without passing through a development processing step, and performing printing, and a method of loading the lithographic printing plate precursor on a printing press, exposing it with an infrared laser on the printing press, and performing printing without passing through a development processing step.

For example, in one embodiment of the negative on-press development-type lithographic printing plate precursor, when the lithographic printing plate precursor is imagewise exposed with an infrared laser and then printing is performed by supplying an aqueous component and an oily ink without passing through a development processing step such as wet development, the image recording layer cured by the exposure forms an oily ink-receiving part having a lipophilic surface in the exposed area of the image recording layer. On the other hand, in the unexposed area, the uncured image recording layer is removed by dissolving or dispersing in the supplied aqueous component and/or oily ink and the hydrophilic support surface in this portion is revealed.

As a result, the aqueous component adheres to the revealed hydrophilic surface and the oily ink adheres to the image recording layer in the exposed region, thereby initiating the printing. Here, either the aqueous component or the oily ink may be first supplied to the plate surface, but the oily ink is preferably first supplied so as to prevent the aqueous component from being contaminated by the image recording layer in the unexposed area. A fountain solution and a printing ink for normal lithographic printing are used as the aqueous component and oily ink, respectively.

In this way, the lithographic printing plate precursor is on-press developed on an off-set printing press and used as-is for printing of a large number of sheets.

EXAMPLES

The present invention is described in greater detail below by referring to the Examples, but the present invention should not be construed as being limited thereto.

Example 1

Preparation of Support

A 0.3 mm-thick aluminum plate according to JIS-A-1050 was treated through the following steps (a) to (k) in this order.

(a) Mechanical Surface-Roughening Treatment

A mechanical surface-roughening treatment was performed by using a rotating roller-shaped nylon brush while supplying an abrasive slurry suspension of an abrasive (quartz sand) having a specific gravity of 1.12 in water to the aluminum plate surface. The average particle diameter of the abrasive was 8 μm and the maximum particle diameter was 50 μm. The nylon brush was made of a 6.10-nylon and had a bristle length of 50 mm and a bristle diameter of 0.3 mm. This nylon brush was produced by perforating holes in a stainless steel-made cylinder having a diameter of 300 mm and densely implanting bristles in the holes. Three rotary brushes were used. The distance between two support rollers (ϕ200 mm) disposed below the brush was 300 mm. The brush roller was pressed to the aluminum plate until the load of the driving motor for rotating the brush became 7 kW larger than the load before the brush roller was pressed. The rotating direction of the brush was the same as the traveling direction of the aluminum plate. The rotation number of the brush was 200 rpm.

(b) Alkali Etching Treatment

An etching treatment was performed by spraying an aqueous NaOH solution (concentration: 26 mass %, aluminum ion concentration: 6.5 mass %) at a temperature of 70° C. on the obtained aluminum plate to dissolve 6 $g/m^2$ of the aluminum plate. Thereafter, the aluminum plate was washed with well water by spraying.

(c) Desmutting Treatment

A desmutting treatment was performed by spraying an aqueous solution having a nitric acid concentration of 1 mass % (containing 0.5 mass % of aluminum ion) at a temperature of 30° C., and then the aluminum plate was water-washed by spraying. For the aqueous nitric acid solution used for the desmutting, the waste solution in the step of performing electrochemical surface-roughening by using AC in an aqueous nitric acid solution was used.

(d) Electrochemical Surface-Roughening Treatment

An electrochemical surface-roughening treatment was continuously performed by using an AC voltage of 60 Hz. At this time, the electrolytic solution was an aqueous solution containing 10.5 g/liter of nitric acid (containing 5 g/liter of aluminum ion) at a temperature of 50° C. The electrochemical surface-roughening treatment was performed by using an AC power source of giving a trapezoidal rectangular wave AC such that the time TP necessary for the current value to reach the peak from zero was 0.8 msec and the duty ratio was 1:1, and disposing a carbon electrode as the counter electrode. The auxiliary anode was ferrite. The electrolytic cell used was a radial cell type. The current density was 30 $A/dm^2$ in terms of the peak value of current, the total quantity of electricity when the aluminum plate was serving as the anode was 220 $C/dm^2$, and 5% of the current flowing from the power source was split to the auxiliary anode. Thereafter, the aluminum plate was washed with well water by spraying.

(e) Alkali Etching Treatment

The aluminum plate was etched at 32° C. by spraying an etching solution having a sodium hydroxide concentration of 26 mass % and an aluminum ion concentration of 6.5 mass % so that 0.20 $g/m^2$ of the aluminum plate was dissolved to remove the smut component mainly comprising aluminum hydroxide produced at the electrochemical surface-roughening performed by using AC in the previous stage and the edge portion of the produced pit was dissolved to smoothen the edge portion. Thereafter, the aluminum plate was washed with well water by spraying. The etched amount was 3.5 $g/m^2$.

(f) Desmutting Treatment

A desmutting treatment was performed by spraying an aqueous solution having a nitric acid concentration of 15 mass % (containing 4.5 mass % of aluminum ion) at a temperature of 30° C., and then the aluminum plate was washed with well water by spraying. For the aqueous nitric acid solution used for the desmutting, the waste solution in the step of performing electrochemical surface-roughening by using AC in an aqueous nitric acid solution was used.

(g) Electrochemical Surface-Roughening Treatment

An electrochemical surface-roughening treatment was continuously performed by using an AC voltage of 60 Hz. At this time, the electrolytic solution was an aqueous solution containing 7.5 g/liter of hydrochloric acid (containing 5 g/liter of aluminum ion) at a temperature of 35° C. The electrochemical surface-roughening treatment was performed by using an AC power source with a rectangular waveform and disposing a carbon electrode as the counter electrode. The auxiliary anode was ferrite. The electrolytic cell used was a radial cell type. The current density was 25 A/dm2 in terms of the peak value of current, and the total quantity of electricity when the aluminum plate was serving as the anode was 50 $C/dm^2$. Thereafter, the aluminum plate was washed with well water by spraying.

(h) Alkali Etching Treatment

The aluminum plate was etched at 32° C. by spraying an etching solution having a sodium hydroxide concentration of 26 mass % and an aluminum ion concentration of 6.5 mass % so that 0.10 $g/m^2$ of the aluminum plate was dissolved to remove the smut component mainly comprising aluminum hydroxide produced at the electrochemical surface-roughening performed by using AC in the previous stage and the edge portion of the produced pit was dissolved to smoothen the edge portion. Thereafter, the aluminum plate was washed with well water by spraying.

(i) Desmutting Treatment

A desmutting treatment was performed by spraying an aqueous solution having a sulfuric acid concentration of 25 mass % (containing 0.5 mass % of aluminum ion) at a temperature of 60° C., and then the aluminum plate was washed with well water by spraying.

(j) Anodization Treatment

For the electrolytic solution, sulfuric acid was used. The electrolytic solution had a sulfuric acid concentration of 170 g/liter (containing 0.5 mass % of aluminum ion) and at a temperature of 43° C. Thereafter, the aluminum plate was washed with well water by spraying. The current density was about 30 $A/dm^2$. The final oxide film coverage was 2.7 $g/m^2$.

(k) Alkali Metal Silicate Treatment

An alkali metal silicate treatment (silicate treatment) was performed by dipping the resulting aluminum plate in a treating tank containing an aqueous 1 mass % No. 3 sodium silicate solution at a temperature of 30° C. for 10 seconds. Thereafter, the aluminum plate was washed with well water by spraying to produce an aluminum support. At this time, the silicate coverage was 3.6 $mg/m^2$.

(Formation of Image Recording Layer)

On the obtained support, Coating Solution (1) for Image Recording Layer having the following composition was coated by a wire bar and dried at 80° C. for 60 seconds to form an image recording layer. The coated amount was 1.0 $g/m^2$.

Composition of Coating Solution (1) for Image Recording Layer:

| | |
|---|---|
| Infrared Absorbing Dye (D-1) shown below | 2 parts by mass |
| Iodonium Salt (Io-1) | 20 parts by mass |
| Dipentaerythritol hexaacrylate (NK Ester A-DPH, produced by Shin-Nakamura Chemical Co., Ltd. | 55 parts by mass |
| Binder Polymer (B-1) shown below | 37 parts by mass |
| Fluorine-Containing Surfactant (W-1) shown below | 6 parts by mass |
| Methyl ethyl ketone | 900 parts by mass |

Infrared Absorbing Dye (D-1):

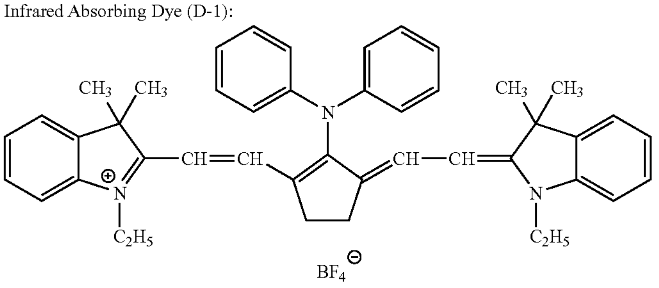

Binder Polymer (B-1):

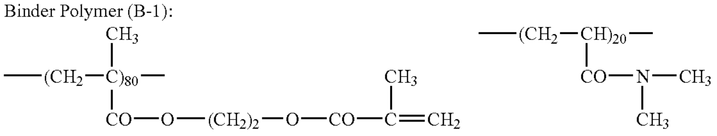

Mass average molecular weight: 65,000

Fluorine-Containing Surfactant (W-1):

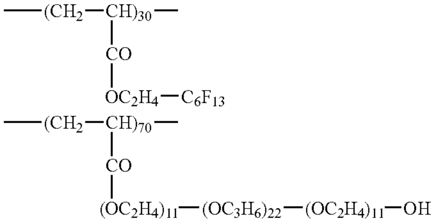

(Evaluation of Lithographic Printing Plate Precursor)

The obtained lithographic printing plate precursor was subjected to the following evaluations. The results are shown in Table 1.

1) Suitability for Plate Inspection:

A test pattern was image-exposed by an image setter (Trendsetter 3244VX, manufactured by Creo) at a beam intensity of 10.2 W and a drum rotation speed of 150 rpm. The contrast between unexposed region and exposed region, that is, clear viewing of image (visibility), was evaluated with ratings of ○: very good, Δ: good or X: not good.

2) Storage Stability:

The obtained lithographic printing plate precursor was left standing in an oven at 50° C. for 40 hours and the colors of the lithographic printing plate precursor before and after standing were compared. The degree of discoloration was evaluated (unexposed plate) with ratings of ○: discoloration could not be confirmed with an eye, Δ: slight discoloration could be recognized with an eye or X: discoloration could be recognized without doubt.

On the other hand, the lithographic printing plate left standing in an oven as above was exposed under the above-described exposure conditions and the contrast between unexposed region and exposed region, that is, clear viewing of image (visibility), was evaluated (exposed plate).

3) On-Press Developability and Press Life:

The plate exposed with a laser as above was loaded on a cylinder of a printing press (SPRINT S26, manufactured by Komori Corp.) without passing through development processing, and printing was performed by supplying a 4 mass % diluted solution of a commercially available fountain stock solution (IF-102, produced by Fuji Photo Film Co., Ltd.) as the fountain solution, then supplying black ink (Values-G (black), produced by Dai-Nippon Ok & Chemicals, Inc.), and further supplying paper. The number of sheets required until a good printed matter could be obtained (on-press developability) and the number of sheets on which an image could be printed without causing staining or thinning (press life) were evaluated.

Examples 2 to 7

Lithographic printing plate precursors were produced and evaluated in the same manner as in Example 1 except that an iodonium salt and an infrared absorbing dye shown in Table 1 were used in place of Iodonium Salt (Io-1) and Infrared Absorbing Dye (D-1). The evaluation results are shown in Table 1.

Comparative Example 1

A lithographic printing plate precursor was produced and evaluated in the same manner as in Example 1 except for using 20 parts by mass of Iodonium Salt (Io-21) shown below in place of 20 parts by mass of Iodonium Salt (Io-1). The evaluation results are shown in Table 1.

Comparative Example 2

A lithographic printing plate precursor was produced and evaluated in the same manner as in Example 1 except for using 20 parts by mass of Iodonium Salt (Io-22) shown below in place of 20 parts by mass of Iodonium Salt (Io-1). The evaluation results are shown in Table 1.

(Io-21)

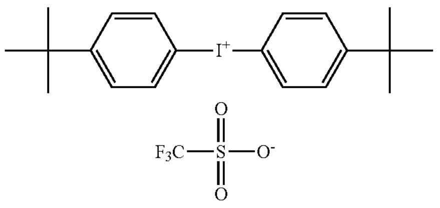

(Io-22)

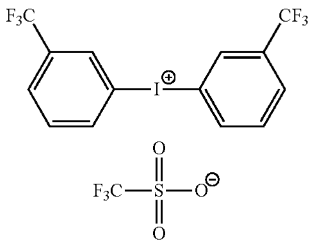

-continued (D-3)

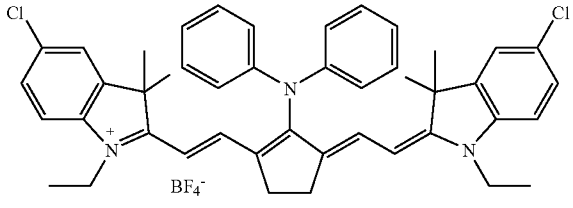

As apparent from Table 1, the lithographic printing plate precursor of the present invention is excellent in the storage stability, the press life, the visibility of plate after exposure and the on-press developability.

Example 8

Preparation of Microcapsule Liquid Dispersion (1)

10 Parts by mass of a 1:3 (by mol) adduct of trimethylolpropane and xylylene diisocyanate (Takenate D-110N, produced by Mitsui Takeda Chemicals, Inc., containing 25 mass % of ethyl acetate), 0.6 parts by mass of Infrared Absorbent (D-4) shown below, 3 parts by mass of dipentaerythritol hexaacrylate, 1.5 parts by mass of tricresyl phosphate and 0.1 part by mass of anionic surfactant (Pionin A-41C, produced

TABLE 1

| | Iodonium Salt | | | Infrared | Suitability for | Storage Stability Unexposed | Storage Stability Exposed | Developability | Press Life |
|---|---|---|---|---|---|---|---|---|---|
| | Structure | σArl | σAr2 | Absorbent | Plate inspection | Plate | Plate | (sheets) | (sheets) |
| Example 1 | (Io-1) | 0.46 | −0.32 | (D-1) | ○ | ○ | ○ | 40 | 15,000 |
| Example 2 | (Io-2) | 0.37 | −0.15 | (D-1) | ○ | ○ | ○ | 60 | 12,000 |
| Example 3 | (Io-3) | 0.32 | −0.09 | (D-2) | ○ | ○ | ○ | 50 | 13,000 |
| Example 4 | (Io-5) | 0.73 | −0.31 | (D-3) | ○ | ○ | ○ | 55 | 11,000 |
| Example 5 | (Io-6) | 0.62 | −0.26 | (D-3) | ○ | ○ | ○ | 45 | 10,000 |
| Example 6 | (Io-7) | 0.74 | −0.53 | (D-3) | ○ | ○ | ○ | 52 | 12,000 |
| Example 7 | (Io-9) | 0.3 | −0.32 | (D-2) | ○ | ○ | ○ | 59 | 14,000 |
| Comparative Example 1 | (Io-21) | −0.15 | −0.15 | (D-1) | Δ | Δ | X | 70 | 11,000 |
| Comparative Example 2 | (Io-22) | 0.46 | 0.46 | (D-1) | Δ | X | X | 50 | 13,000 |

Infrared Absorbents (D-2) and (D-3) in Table 1 are shown below.

(D-2)

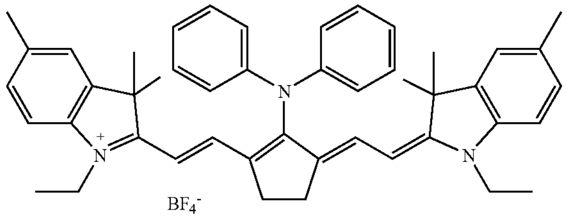

by Takemoto Yushi Co., Ltd.) were dissolved/dispersed in 16.5 parts by mass of ethyl acetate to obtain an oil phase.

Separately, 37.5 parts by mass of an aqueous 4 mass % polyvinyl alcohol (PVA-205, produced by Kuraray Co., Ltd.) solution was prepared and used as an aqueous phase.

The oil phase and the aqueous phase were mixed and emulsified under water cooling in a homogenizer at 12,000 rpm for 10 minutes. Thereafter, 24.5 parts by mass of water was added to the resulting emulsified product and the mixture was stirred at room temperature for 30 minutes and further stirred at 40° C. for 3 hours. To this liquid dispersion, pure water was added to give a solid content concentration of 15 mass %, thereby preparing Microcapsule Liquid Dispersion (1). The average particle diameter of microcapsules was 0.30 μm.

(D-4)

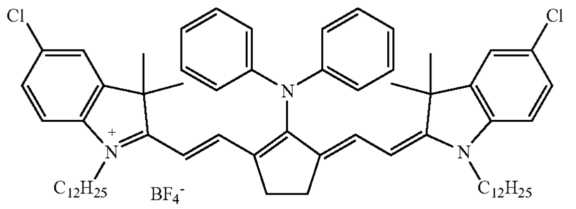

(Formation of Image Forming Layer)

On the support produced in Example 1, Coating Solution (2) for Image Forming Layer having the following composition was coated by a wire bar and dried at 80° C. for 60 seconds to form a photosensitive image forming layer. The coated amount was 1.0 g/m$^2$.

Composition of Coating Solution (2) for Image Forming Layer:

| | |
|---|---|
| Infrared Absorbing Dye (D-1) | 2 parts by mass |
| Iodonium Salt (Io-1) | 10 parts by mass |
| Dipentaerythritol hexaacrylate (NK Ester A-DPH, produced by Shin-Nakamura Chemical Co., Ltd.) | 40 parts by mass |
| Binder Polymer (B-1) | 16 parts by mass |
| Microcapsule Liquid Dispersion (1) | 300 parts by mass |
| Fluorine-Containing Surfactant (W-1) | 1 part by mass |
| Methyl ethyl ketone | 100 parts by mass |
| 1-Methoxy-2-propanol | 850 parts by mass |
| Pure water | 200 parts by mass |

On the image forming layer (2) formed above, Coating Solution (1) for Water-Soluble Overcoat Layer having the following composition was coated by a wire bar to give a dry coated amount of 1.5 g/m$^2$ and then dried at 100° C. for 90 seconds to produce a lithographic printing plate precursor. The produced lithographic printing plate precursor was evaluated in the same manner as in Example 1. The results are shown in Table 2.

Composition of Coating Solution (1) for Water-Soluble Overcoat Layer:

| | |
|---|---|
| Polyvinyl alcohol (saponification degree: 98 mol %, polymerization degree: 500) | 95 parts by mass |
| Polyvinylpyrrolidone/vinyl acetate copolymer (Luvitec VA 64W, produced by BASF) | 4 parts by mass |
| Nonionic surfactant (EMALEX 710, produced by Nihon Emulsion Co., Ltd.) | 1 part by mass |
| Pure water | 2,150 parts by mass |

Examples 9 to 11

Lithographic printing plate precursors were produced in the same manner as in Example 8 except for using an iodonium salt shown in Table 2 in place of Iodonium Salt (Io-1), and evaluated in the same manner as in Example 1. The evaluation results are shown in Table 2.

Comparative Example 3

A lithographic printing plate precursor was produced in the same manner as in Example 8 except for using Iodonium Salt (Io-22) in place of Iodonium Salt (Io-1), and evaluated in the same manner as in Example 1. The evaluation results are shown in Table 2.

TABLE 2

| | Iodonium Salt | | | Suitability for | Storage Stability | | Developability | Press Life |
|---|---|---|---|---|---|---|---|---|
| | | | | | Unexposed | Exposed | | |
| | Structure | σAr1 | σAr2 | Plate Inspection | Plate | Plate | (sheets) | (sheets) |
| Example 8 | (Io-1) | 0.46 | −0.32 | ○ | ○ | ○ | 20 | 18,000 |
| Example 9 | (Io-2) | 0.37 | −0.15 | ○ | ○ | ○ | 25 | 16,000 |
| Example 10 | (Io-3) | 0.32 | −0.09 | ○ | ○ | ○ | 28 | 15,000 |
| Example 11 | (Io-9) | 0.3 | −0.32 | ○ | ○ | ○ | 30 | 14,000 |
| Comparative Example 3 | (Io-22) | 0.46 | 0.46 | Δ | X | X | 31 | 14,000 |

Example 12

Formation of Image Forming Layer

On the support produced in Example 1, Coating Solution (3) for Image Forming Layer having the following composition was coated by a wire bar and dried at 80° C. for 60 seconds to form a photosensitive image forming layer. The coated amount was 1.0 g/m$^2$.

Composition of Coating Solution (3) for Image Forming Layer:

| | |
|---|---|
| Infrared Absorbing Dye (D-1) | 2 parts by mass |
| Iodonium Salt (Io-1) | 15 parts by mass |
| Dipentaerythritol hexaacrylate (NK Ester A-DPH, produced by Shin-Nakamura Chemical Co., Ltd.) | 55 parts by mass |
| Binder Polymer (B-1) | 37 parts by mass |
| Leuco Crystal Violet (produced by Tokyo Kasei Kogyo Co., Ltd.) | 10 parts by mass |
| Fluorine-Containing Surfactant (W-1) | 6 parts by mass |
| Methyl ethyl ketone | 900 parts by mass |

The obtained lithographic printing plate precursor was evaluated in the same manner as in Example 1. The results are as follows. Suitability for plate inspection: ○, storage stability: ○ for unexposed plate and ○ for exposed plate, developability: 50 sheets, and press life: 13,000 sheets.

Example 13

Formation of Image Forming Layer

On the support produced in Example 1, Coating Solution (4) for Image Forming Layer having the following composition was coated by a wire bar and dried at 80° C. for 60 seconds to form a photosensitive image forming layer. The coated amount was 1.0 g/$m^2$.

Composition of Coating Solution (4) for Image Forming Layer:

| | |
|---|---|
| Infrared Absorbing Dye (D-1) | 2 parts by mass |
| Iodonium Salt (Io-5) | 10 parts by mass |
| Dipentaerythritol hexaacrylate (NK Ester A-DPH, produced by Shin-Nakamura Chemical Co., Ltd.) | 55 parts by mass |
| Binder Polymer (B-1) | 37 parts by mass |
| Fluorine-Containing Surfactant (W-1) | 1 part by mass |
| Methyl ethyl ketone | 900 parts by mass |

On the photosensitive image forming layer, Coating Solution (2) for Water-Soluble Overcoat Layer having the following composition was coated by a wire bar to give a dry coated amount of 1.5 g/$m^2$ and then dried at 100° C. for 90 seconds to produce a lithographic printing plate precursor.

Composition of Coating Solution (2) for Water-Soluble Overcoat Layer:

| | |
|---|---|
| Polyvinyl alcohol (saponification degree: 98 mol %, polymerization degree: 500) | 95 parts by mass |

-continued

| | |
|---|---|
| Polyvinylpyrrolidone/vinyl acetate copolymer (Luvitec VA 64W, produced by BASF) | 4 parts by mass |
| Nonionic surfactant (EMALEX 710, produced by Nihon Emulsion Co., Ltd.) | 1 part by mass |
| Microcapsule Liquid Dispersion (1) | 1,000 parts by mass |
| Pure water | 2,150 parts by mass |

The obtained lithographic printing plate precursor was evaluated in the same manner as in Example 1. The results are as follows. Suitability for plate inspection: ○, storage stability: ○ for unexposed plate and ○ for exposed plate, developability: 20 sheets, and press life: 13,000 sheets.

Example 14

Formation of Image Forming Layer

On the support produced in Example 1, Coating Solution (5) for Image Forming Layer having the following composition was coated by a wire bar and dried at 80° C. for 60 seconds to form a photosensitive image forming layer. The coated amount was 1.0 g/$m^2$.

Composition of Coating Solution (5) for Image Forming Layer:

| | |
|---|---|
| Infrared Absorbing Dye (D-1) | 2 parts by mass |
| Iodonium Salt (II-1) | 20 parts by mass |
| Dipentaerythritol hexaacrylate (NK Ester A-DPH, produced by Shin-Nakamura Chemical Co., Ltd.) | 55 parts by mass |
| Binder Polymer (B-1) | 37 parts by mass |
| Fluorine-Containing Surfactant (W-1) | 6 parts by mass |
| Methyl ethyl ketone | 900 parts by mass |

The obtained lithographic printing plate precursor was evaluated in the same manner as in Example 1. The results are shown in Table 3.

Examples 15 to 20

Lithographic printing plate precursors were produced in the same manner as in Example 4 except that an iodonium salt and an infrared absorbing dye shown in Table 3 were used in place of Iodonium Salt (II-1) and Infrared Absorbing Dye (D-1). The produced lithographic printing plate precursors were evaluated in the same manner as in Example 1. The results are shown in Table 3.

TABLE 3

| | Iodonium Salt | | | Infrared | Suitability for | Storage Stability | | Developability | Press Life |
|---|---|---|---|---|---|---|---|---|---|
| | Structure | σAr1 | σAr2 | Absorbent | Plate Inspection | Unexposed Plate | Exposed Plate | (sheets) | (sheets) |
| Example 14 | (II-1) | −0.32 | −0.37 | (D-1) | ○ | ○ | ○ | 30 | 14,000 |
| Example 15 | (II-2) | −0.32 | −0.84 | (D-1) | ○ | ○ | ○ | 20 | 11,000 |
| Example 16 | (II-3) | −0.32 | −0.64 | (D-2) | ○ | ○ | ○ | 30 | 15,000 |
| Example 17 | (II-4) | 0 | −0.84 | (D-3) | ○ | ○ | ○ | 15 | 10,000 |
| Example 18 | (II-5) | −0.27 | −0.14 | (D-3) | ○ | ○ | ○ | 35 | 16,000 |
| Example 19 | (II-6) | −0.42 | −0.56 | (D-3) | ○ | ○ | ○ | 30 | 12,000 |
| Example 20 | (II-7) | −0.27 | −0.32 | (D-2) | ○ | ○ | ○ | 40 | 17,000 |

As apparent from Table 3, the lithographic printing plate precursor of the present invention is excellent in the storage stability, the press life, the visibility of plate after exposure and the on-press developability.

Example 21

Preparation of Microcapsule Liquid Dispersion (2)

10 Parts by mass of a 1:3 (by mol) adduct of trimethylolpropane and xylylene diisocyanate (Takenate D-110N, produced by Mitsui Takeda Chemicals, Inc., containing 25 mass % of ethyl acetate), 0.6 parts by mass of Infrared Absorbing Dye (D-4), 3 parts by mass of dipentaerythritol hexaacrylate, 1.5 parts by mass of tricresyl phosphate and 0.1 part by mass of anionic surfactant (Pionin A-41C, produced by Takemoto Yushi Co., Ltd.) were dissolved/dispersed in 16.5 parts by mass of ethyl acetate to obtain an oil phase.

Separately, 37.5 parts by mass of an aqueous 4 mass % polyvinyl alcohol (PVA-205, produced by Kuraray Co., Ltd.) solution was prepared and used as an aqueous phase.

The oil phase and the aqueous phase were mixed and emulsified under water cooling in a homogenizer at 12,000 rpm for 10 minutes. Thereafter, 24.5 parts by mass of water was added to the resulting emulsified product and the mixture was stirred at room temperature for 30 minutes and further stirred at 40° C. for 3 hours. To this liquid dispersion, pure water was added to give a solid content concentration of 15 mass %, thereby preparing Microcapsule Liquid Dispersion (2). The average particle diameter of microcapsules was 0.30 μm.

(Formation of Image Forming Layer)

On the support produced in Example 1, Coating Solution (6) for Image Forming Layer having the following composition was coated by a wire bar and dried at 80° C. for 60 seconds to form a photosensitive image forming layer. The coated amount was 1.0 g/$m^2$.

Composition of Coating Solution (6) for Image Forming Layer:

| | |
|---|---|
| Infrared Absorbing Dye (D-1) | 2 parts by mass |
| Iodonium Salt (II-1) | 10 parts by mass |
| Dipentaerythritol hexaacrylate (NK Ester A-DPH, produced by Shin-Nakamura Chemical Co., Ltd.) | 40 parts by mass |
| Binder Polymer (B-1) | 16 parts by mass |
| Microcapsule Liquid Dispersion (2) | 300 parts by mass |
| Fluorine-Containing Surfactant (W-1) | 1 part by mass |
| Methyl ethyl ketone | 100 parts by mass |
| 1-Methoxy-2-propanol | 850 parts by mass |
| Pure water | 200 parts by mass |

On the image forming layer (6) formed above, Coating Solution (3) for Water-Soluble Overcoat Layer having the following composition was coated by a wire bar to give a dry coated amount of 1.5 g/$m^2$ and then dried at 100° C. for 90 seconds to produce a lithographic printing plate precursor. The produced lithographic printing plate precursor was evaluated in the same manner as in Example 1. The results are shown in Table 4.

Composition of Coating Solution (3) for Water-Soluble Overcoat Layer:

| | |
|---|---|
| Polyvinyl alcohol (saponification degree: 98 mol %, polymerization degree: 500) | 95 parts by mass |
| Polyvinylpyrrolidone/vinyl acetate copolymer (Luvitec VA 64W, produced by BASF) | 4 parts by mass |
| Nonionic surfactant (EMALEX 710, produced by Nihon Emulsion Co., Ltd.) | 1 part by mass |
| Pure water | 2,150 parts by mass |

Examples 22 to 24

Lithographic printing plate precursors were produced in the same manner as in Example 8 except for using an iodonium salt shown in Table 4 in place of Iodonium Salt (II-1). The produced lithographic printing plate precursors were evaluated in the same manner as in Example 1. The evaluation results are shown in Table 4.

TABLE 4

| | Iodonium Salt | | | Suitability for | Storage Stability | | Developability | Press Life |
|---|---|---|---|---|---|---|---|---|
| | Structure | σAr1 | σAr2 | Plate Inspection | Unexposed Plate | Exposed Plate | (sheets) | (sheets) |
| Example 21 | (II-1) | −0.32 | −0.37 | ○ | ○ | ○ | 25 | 19,000 |
| Example 22 | (II-2) | −0.32 | −0.84 | ○ | ○ | ○ | 20 | 17,000 |
| Example 23 | (II-4) | 0 | −0.84 | ○ | ○ | ○ | 15 | 14,000 |
| Example 24 | (II-5) | −0.27 | −0.14 | ○ | ○ | ○ | 20 | 18,000 |

As apparent from Table 4, the lithographic printing plate precursor of the present invention is excellent in the storage stability, the press life, the visibility of plate after exposure and the on-press developability.

Example 25

Formation of Image Recording Layer

On the support produced in Example 1, Coating Solution (7) for Image Recording Layer having the following composition was coated by a wire bar and dried at 80° C. for 60 seconds to form a photosensitive image forming layer. The coated amount was 1.0 g/$m^2$.

Composition of Coating Solution (7) for Image Forming Layer:

| | |
|---|---|
| Infrared Absorbing Dye (D-1) shown below | 2 parts by mass |
| Iodonium Salt (II-1) | 15 parts by mass |
| Dipentaerythritol hexaacrylate (NK Ester A-DPH, produced by Shin-Nakamura Chemical Co., Ltd. | 55 parts by mass |
| Binder Polymer (B-1) | 37 parts by mass |
| Leuco Crystal Violet (produced by Tokyo Kasei Kogyo Co., Ltd.) | 10 parts by mass |
| Fluorine-Containing Surfactant (W-1) | 6 parts by mass |
| Methyl ethyl ketone | 900 parts by mass |

The obtained lithographic printing plate precursor was evaluated in the same manner as in Example 1. The results are as follows. Suitability for plate inspection: ○, storage stability: ○ for unexposed plate and ○ for exposed plate, developability: 45 sheets, and press life: 12,000 sheets.

What is claimed is:

1. A lithographic printing method comprising printing by loading a lithographic printing plate precursor on a printing press without passing through a development process after recording an image or by recording an image after loading the lithographic printing plate precursor on a printing press, wherein the lithographic printing plate precursor comprises, in the following order: a support; a radical-polymerizable image recording layer capable of drawing an image by exposure with an infrared laser, which allows for printing by loading the precursor on a printing press without passing through a development process after recording an image or by recording an image after loading the precursor on a printing press; and a protective layer, and wherein the radical-polymerizable image recording layer comprises a radical-polymerizable compound, an infrared absorbent and an iodonium salt represented by the following formula (1a):

$$Ar_{1a}-\overset{\oplus}{I}-Ar_{2a}\quad \overset{\ominus}{Z} \qquad \text{(Ia)}$$

wherein $Ar_{1a}$ represents a benzene ring having a substituent, provided that a total of Hammett's σ values of substituents is a negative value, $Ar_{2a}$ represents a benzene ring having a substituent, provided that a total of Hammett's σ values of substituents is a positive value, and Z represents a counter anion.

2. A lithographic printing method comprising printing by loading a lithographic printing plate precursor on a printing press without passing through a development process after recording an image or by recording an image after loading a lithographic printing plate precursor on a printing press, wherein the lithographic printing plate precursor comprises: a support; and a radical-polymerizable image recording layer capable of drawing an image by exposure with an infrared laser, which allows for printing by loading the precursor on a printing press without passing through a development process after recording an image or by recording an image after loading the precursor on a printing press, and the radical-polymerizable image recording layer comprises a radical-polymerizable compound, an infrared absorbent and an iodonium salt represented by the following formula (1a):

$$Ar_{1a}-\overset{\oplus}{I}-Ar_{2a}\quad \overset{\ominus}{Z} \qquad \text{(1a)}$$

wherein $Ar_{1a}$ represents a benzene ring having a substituent, provided that a total of Hammett's σ values of substituents is a negative value, $Ar_{2a}$ represents a benzene ring having a substituent, provided that a total of Hammett's σ values of substituents is a positive value, and Z represents a counter anion.

3. The lithographic printing method as claimed in claim 2, wherein the iodonium salt is represented by the following formula (2):

(2)

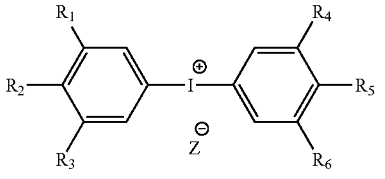

wherein $R_1$ to $R_6$ each independently represent a hydrogen atom, an alkyl group, $—NR_7R_8$ or $—OR_7$, and, wherein, when one of $R_2$ and $R_5$ is an alkyl group, the other is a hydrogen atom, an alkyl group or $—NR_7R_8$, and when one of $R_2$ and $R_5$ is $—OR_7$, the other is a hydrogen atom, $—OR_7$ or $—NR_7R_8$, and neither $R_1$ to $R_3$ nor $R_4$ to $R_6$ are hydrogen atoms at the same time, and $R_7$ and $R_8$ each independently represent a hydrogen atom, an alkyl group, an aryl group, an alkenyl group or an alkynyl group.

4. The lithographic printing method as claimed in claim 3, wherein the substituents represented by $—NR_7R_8$, an alkyl group and $—OR_7$ are selected from substituents represented by the following formulae:

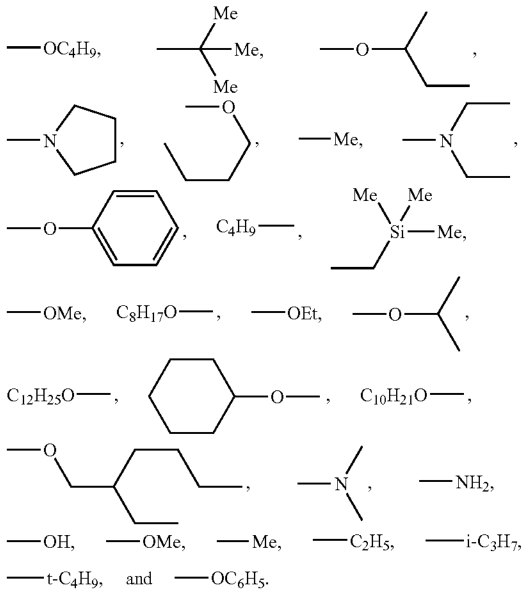

5. The lithographic printing method as claimed in claim 1, wherein the benzene ring represented by $Ar_{2a}$ has, as the substituent having a positive Hammett's σ value, a substituent selected from the group consisting of: a halogen, a haloalkyl, a cyano group, a nitro group, $—OCOR_7$, $—OSO_2R_7$, $—COR_7$, $—COOR_7$, $—CONR_7R_8$ and $—SO_2R_7$ positioned at a meta-position of the benzene ring; and a halogen, a haloalkyl, a cyano group, a nitro group, $—OCOR_7$, $—OSO_2R_7$, $—COR_7$, $—COOR_7$, $—CONR_7R_8$ and $—SO_2R_7$ positioned at a para-position of the benzene ring, wherein $R_7$ and $R_8$ each independently represents hydrogen, an alkyl group, an aryl group, an alkenyl group or an alkynyl group.

6. The lithographic printing method as claimed in claim 2, wherein the benzene ring represented by $Ar_{2a}$ has, as the substituent having a positive Hammett's σ value, a substituent selected from the group consisting of: a halogen, a haloalkyl, a cyano group, a nitro group, $—OCOR_7$, $—OSO_2R_7$, $—COR_7$, $—COOR_7$, $—CONR_7R_8$ and $—SO_2R_7$ positioned at a meta-position of the benzene ring; and a halogen, a haloalkyl, a cyano group, a nitro group, $—OCOR_7$, $—OSO_2R_7$, $—COR_7$, $—COOR_7$, $—CONR_7R_8$ and $—SO_2R_7$ positioned at a para-position of the benzene ring, wherein $R_7$ and $R_8$ each independently represents hydrogen, an alkyl group, an aryl group, an alkenyl group or an alkynyl group.

* * * * *